United States Patent
Tanaka

(10) Patent No.: US 6,965,257 B2
(45) Date of Patent: Nov. 15, 2005

(54) MULTISTAGE LEVEL DISCRIMINATION CIRCUIT

(75) Inventor: Takayuki Tanaka, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/448,303

(22) Filed: May 30, 2003

(65) Prior Publication Data

US 2003/0231032 A1 Dec. 18, 2003

(30) Foreign Application Priority Data

Jun. 13, 2002 (JP) .................................... 2002-172240
Mar. 17, 2003 (JP) .................................... 2003-071315

(51) Int. Cl.[7] ............................................. H03K 5/153
(52) U.S. Cl. .............................. 327/58; 327/60; 327/62
(58) Field of Search ............................ 327/58, 59, 60, 327/62, 72, 74; 398/202, 209; 359/189, 194

(56) References Cited

U.S. PATENT DOCUMENTS

| | | | | |
|---|---|---|---|---|
| 5,892,609 A | * | 4/1999 | Saruwatari | ................. 398/202 |
| 6,018,407 A | | 1/2000 | Hatakeyama et al. | ....... 359/189 |
| 6,151,150 A | * | 11/2000 | Kikuchi | ..................... 398/209 |
| 6,215,335 B1 | * | 4/2001 | Rabii | ........................... 327/74 |
| 6,671,075 B1 | * | 12/2003 | Mizunaga | .................... 327/74 |

FOREIGN PATENT DOCUMENTS

| | | |
|---|---|---|
| JP | 08-293838 | 11/1996 |
| JP | 9312528 | 12/1997 |
| JP | 10-84231 | 3/1998 |

* cited by examiner

Primary Examiner—Tuan T. Lam
Assistant Examiner—Hiep Nguyen
(74) Attorney, Agent, or Firm—Rabin & Berdo, P.C.

(57) ABSTRACT

A level discrimination circuit includes two offset compensation circuits. Each offset compensation circuit receives a differential pair of input signals, detects their peak values, and adds the peak value of each input signal to the other input signal, thereby generating an offset-compensated differential pair of output signals. The output signals of the first offset compensation circuit are used directly as the input signals of the second offset compensation circuit. The output signals of the second offset compensation circuit therefore have the correct duty cycle, and can be correctly discriminated by a comparator, even if the input signals to the first offset compensation circuit are burst signals in which each burst includes a large direct-current bias. This level discrimination circuit is suitable for receiving optical signals transmitted in bursts.

13 Claims, 19 Drawing Sheets

OUT 
"H" "L" "H" "L"

OUT 
"H"

ns. More particularly, the invention relates to a level discrimination circuit of the type that automatically controls the threshold level used to determine the data values of the received signal.

MULTISTAGE LEVEL DISCRIMINATION CIRCUIT

BACKGROUND OF THE INVENTION

1. Field of the Invention

The present invention relates to a signal receiving circuit that receives, for example, signal bursts from a passive optical network (PON). More particularly, the invention relates to a level discrimination circuit of the type that automatically controls the threshold level used to determine the data values of the received signal.

2. Description of the Related Art

A circuit that receives optical signals has the general structure shown in FIG. 8, comprising a photodiode 1, a preamplifier 2, and a level discrimination circuit 3 that may also function as an automatic threshold control (ATC) circuit. The automatic threshold control feature is essential in a circuit that receives burst signals from a passive optical network. The threshold must be raised to the optimum level at the beginning of each burst, the optimum level being the threshold level that best enables the values of the received data to be correctly identified.

In the optical signal receiving circuit in FIG. 8, the optical signal is received by the photodiode 1 and thereby converted to a current signal. The preamplifier 2 converts the current signal to a voltage signal. The level discrimination circuit (or ATC circuit) 3 converts the voltage signal to a complementary pair of signals, referred to below as a positivephase signal and a negative-phase signal, that exhibit use of the optimum threshold level. Generally speaking, this is the level disposed at the midpoint of the voltage signal amplitude.

FIG. 9 shows the structure of a conventional level discrimination circuit. FIGS. 10A, 10B, 10C, 10D, and 10E show waveforms indicating signals and voltages in the conventional level discrimination circuit in FIG. 9. This conventional level discrimination circuit comprises a differential amplifier 10, a comparator 20, a pair of peak detection (DET) circuits 11, 12, a pair of summing circuits 13, 14, a reference voltage source 21 that generates a reference voltage Vref1, and a reference voltage source 22 that generates another reference voltage Vref2. The peak detection circuits 11, 12, summing circuits 13, 14, and reference voltage sources 21, 22 constitute an offset compensation circuit. A level discrimination circuit of this type is described in, for example, U.S. Pat. Nos. 5,892,609 and 5,822,104 (and corresponding Japanese Unexamined Patent Application Publications No. 10-84231 and 08-293838).

In the level discrimination circuit in FIG. 9, the differential amplifier 10 receives a signal marked INPUT from the preamplifier 2 and reference voltage Vref1 from reference voltage source 21 (see FIG. 10A). The differential amplifier 10 generates a differential pair of voltage signals A1, NA1, outputs the positivephase voltage A1 to peak detection circuit 12 and summing circuit 13, and outputs the negativephase voltage NA1 to peak detection circuit 11 and summing circuit 14. As shown in FIG. 10B, positive and negative are with respect to Vref1.

The first peak detection circuit 11 senses the peak voltage of the negativephase voltage NA1, and outputs this negative-phase peak voltage NAP1 to summing circuit 13. The second peak detection circuit 12 senses the peak voltage of the positive-phase voltage A1, and outputs this positive-phase peak voltage AP1 to summing circuit 14 (see FIG. 10C).

Summing circuit 13 also receives the positive-phase voltage A1 and the reference voltage Vref 2 generated in reference voltage source 22. Summing circuit 13 adds the positive-phase voltage A1 and the negative-phase peak voltage NAP1, using the reference voltage Vref2 as a reference, and outputs the sum as a positive-phase voltage B1 to the comparator 20. Summing circuit 14 adds the negative-phase voltage NA1 and the positive-phase peak voltage AP1, using reference voltage Vref2 as a reference, and outputs the sum as a negative-phase voltage NB1 to the comparator 20 (see FIG. 10D).

The comparator 20 receives the positive-phase voltage B1 as its noninverting input and the negative-phase voltage NB1 as its inverting input and compares the level of voltage B1 with the level of voltage NB1, thereby discriminating the logic level of the received signal. The comparator 20 outputs a positive received data signal OUT and a negative received data signal NOUT with logic values of '1' (High) or '0' (Low), as shown in FIG. 10E.

Automatic threshold control is carried out in that regardless of the amplitude of the input signal (INPUT in FIGS. 9 and 10A), and regardless of its offset in relation to reference voltage Vref1, it is converted to a positive-phase voltage B1 and a negative-phase voltage NB1 having the same direct current (dc) level and amplitude but opposite logic. The '1' and '0' logic levels are clearly discriminated as equal but opposite differences between the offset-compensated positive-phase voltage B1 and the offset-compensated negative-phase voltage NB1.

FIG. 11 shows the structure of a conventional multistage level discrimination circuit using the same reference characters as in FIG. 9 for similar elements. This conventional multistage level discrimination circuit comprises a first-stage differential amplifier 10, a first-stage offset compensation circuit 30, a second-stage differential amplifier 15, a second-stage offset compensation circuit 31, and a comparator 20. The first-stage offset compensation circuit 30 and second-stage offset compensation circuit 31 both have the circuit configuration shown in FIG. 9. The second-stage offset compensation circuit 31 includes a pair of peak detection circuits 16, 17, a pair of summing circuits 18, 19, a comparator 20, and a reference voltage source 23 that generates a reference voltage Vref3. A multistage level discrimination circuit of this type is described in, for example, U.S. Pat. No. 5,892,609 (and corresponding Japanese Unexamined Pat. Application Publication No. 10-84231).

In the conventional multistage level discrimination circuit in FIG. 11, the positive-phase voltage B1 and the negative-phase voltage NB1 output from the first-stage offset compensation circuit 30 are input to the second-stage differential amplifier 15. The second-stage differential amplifier 15 receives the positive-phase voltage B1 as its non-inverting input and the negative-phase voltage NB1 as its inverting input, generates a positive-phase differential voltage A2 and a negative-phase differential voltage NA2, outputs the positive-phase voltage A2 to peak detection circuit 17 and summing circuit 18 of the second-stage offset compensation circuit 31, and outputs the negative-phase voltage NA2 to peak detection circuit 16 and summing circuit 19 in the second-stage offset compensation circuit 31.

In the second-stage offset compensation circuit 31, the first peak detection circuit 16 senses the peak voltage of the negative-phase voltage NA2, and outputs a negative-phase peak voltage NAP2 to summing circuit 18. The second peak detection circuit 17 senses the peak voltage of the positivephase voltage A2, and outputs a positive-phase peak voltage AP2 to summing circuit 19.

Summing circuit 18 also receives the positive-phase voltage A2 and a reference voltage Vref3 generated by reference voltage source 23. Summing circuit 18 adds the positive-phase voltage A2 and the negative-phase peak voltage NAP2, using Vref3 as a reference, and outputs the sum as a positive-phase voltage B2 to the comparator 20. Summing circuit 19 adds the negative-phase voltage NA2 and the positive-phase peak voltage AP2, using Vref3 as a reference, and outputs the sum as a negative-phase voltage NB2 to the comparator 20.

The reference voltage Vref3 described above is generated with reference to the operating voltage range of the second-stage differential amplifier 15; the center voltage of the operating voltage range of the differential amplifier 15, for example, may be used as Vref3. The purpose of reference voltage Vref3 is to enable the summing circuits 18, 19 to operate within their dynamic range.

In a single-stage level discrimination circuit of the type shown in FIG. 9 the peak voltages AP1 and NAP1 may include a certain amount of error due imperfect operation of the peak detection circuits 11, 12. As a result, dc offset compensation is imperfect, causing the dc levels of the positive-phase and negative-phase voltages B1, NB1 to differ; that is, the High and Low levels of the positive-phase voltage B1 differ from the High and Low levels of the negative-phase voltage NB1.

Moreover, if the received burst optical signal includes bias light, then even if the peak detection circuits 11, 12 operate perfectly, a single-stage level discrimination circuit of the type shown in FIG. 9 cannot compensate completely for dc offset: the High and Low levels of the positive-phase voltage B1 will be higher than the High and Low levels of the negative-phase voltage NB1.

FIG. 12 shows how bias light is defined in a burst optical signal. FIG. 13 shows the general form of the gain characteristic of the pre amplifier 2 in FIG. 8, showing how the gain depends on the input current. FIG. 14 shows the waveform of the negative-phase signal output from the preamplifier 2 (the input signal received by the level discrimination circuit) when a burst optical signal including a large amount of bias optical power is received.

As shown in FIG. 12, bias light is the offset in optical power from the no-signal level between bursts to the Low signal level during a burst. Because of bias light, peak detection circuit 11 may be unable to detect the actual peak value of the negative-phase signal NA1 during a burst, detecting the no-signal level instead.

As shown in FIG. 13, the pre amplifier 2 has a gain saturation characteristic such that the gain decreases when the input current exceeds a certain value. Accordingly, if the bias light uses up a large amount of the linear region of the preamplifier 2, as may happen when the received burst optical signal includes a large amount of bias light the difference between the no-signal level (the detected peak) and the High level (the actual peak) of the negative-phase signal NA1 may be comparable to the difference between the High and Low levels, as shown in FIG. 14.

As a result, the duty cycle of the comparator output is degraded: the duration of periods in which the positive phase signal B1 output from summing circuit 13 has a lower voltage than the negative-phase signal NB1 output from summing circuit 14 is significantly shortened, so that in the output of the comparator 20, the Low ("L") logic-level periods are markedly shorter than the High ("H") logic-level periods, as illustrated in FIG. 15. In the extreme case, the positive-phase signal voltage never goes below the negative-phase signal voltage, and the comparator output always indicates the High logic level, as illustrated in FIG. 16.

A multistage level discrimination circuit of the type shown in FIG. 11 mitigates this problem by amplifying the difference between the positive-phase voltage B1 and the negative-phase voltage NB1. In the amplified negative-phase signal NA2, the difference between the High and Low levels is enhanced, so the detected peak value NAP2 is closer to the actual peak value. If the amount of bias light is not too great, the detected peak value NAP2 will be equal to the actual peak value, in which case the second-stage positive-phase voltage and negative-phase signals B2, NB2 will have the same dc level and correct data output signals will be obtained from the comparator 20.

If an optical signal burst including a large amount of bias optical power is received, however, the second-stage negative-phase peak value NAP2 may still differ significantly from the actual peak value, so the problems noted above remain. That is, the duty cycle of the comparator output is degraded (FIG. 15), or in the extreme case, the Low logic level disappears (FIG. 16). In FIG. 15, it becomes difficult to sample the Low logic level accurately. In FIG. 16, it becomes impossible; the received data signal is completely hidden.

Conventional methods for accurately receiving an optical signal burst including bias light are described in a Document A (by M. Nakamura, N. Ishihara, and Y. Akazawa entitled "A 156 Mb/s CMOS Optical Receiver ICs for Burst-mode Transmission", 1997, 8th International Workshop on Optical/Hybrid Access Networks Conference Proceedings Poster Session p. 12) and a Document B (by K. Takeda et al. entitled "FSAN taio 156 Mb/s 3.3V basuto hikari jushinki yo 1 chippu LSI"(1 chip LSI for a 156 Mb/s 3.3V burst optical receiver for FSAN), 1999 IEICE General Conference, SC-12-3). In the methods described in Documents A and B, the feedback resistance in the preamplifier 2 in FIG. 8 is switched for each optical signal burst, thereby avoiding the use of the saturation region of the gain characteristic shown in FIG. 13 and preventing a large dc offset in the signal output from the preamplifier 2.

In the conventional methods described in Documents A and B, however, another resistor and a switch have to be added to the circuit in order to switch the feedback resistance, and an extra capacitor has to be added on the input terminal of the preamplifier 2, so the frequency characteristic and the noise characteristic in the preamplifier 2 are significantly degraded. This lowers the performance characteristics of the burst optical signal receiving circuit, degrades the receiving sensitivity, and narrows the receiving dynamic range. These problems render the methods described in Documents A and B impractical.

SUMMARY OF THE INVENTION

An object of the present invention is to provide a level discrimination circuit that can generate data output signals with the correct duty cycle from a received burst signal, such as an optical burst signal, even if each burst includes a dc offset, such as an offset caused by bias light.

The inventive level discrimination circuit includes two offset compensation circuits.

The first offset compensation circuit receives a differential pair of input signals, detects their peak values, and adds the peak value of each input signal to the other input signal, thereby generating a first offset-compensated differential pair of signals.

The second offset compensation circuit receives the first offset-compensated differential pair of signals, detects their peak values, and adds the detected peak value of each signal in the first offset-compensated differential pair to the other signal in the first offset-compensated differential pair, thereby generating a second offset compensated differential pair of signals.

The second offset compensation circuit detects peak values correctly, because it operates directly on the first offset-compensated differential pair of signals instead of a differentially amplified version thereof. The second offset-compensated differential pair of signals therefore has a correct duty cycle with equal High and Low durations.

The second offset compensation circuit may include a pair of summing circuits, both of which receive the same one of the detected peak values as an inverting input, so that the second offset-compensated differential pair of signals is referenced to this detected peak value. Use of a detected peak value as a reference voltage facilitates the design of the summing circuits so as to operate within their dynamic range.

The level discrimination circuit may also include a comparator that compares the second pair of offset-compensated signals and generates positive-phase and negative-phase data output signals. Like the second offset-compensated differential pair of signals, the data output signals have a correct duty cycle with equal High and Low durations.

Given that the input signals are received in bursts, the level discrimination circuit may further include a data detection circuit for detecting the start of a burst, an envelope signal generating circuit generating an envelope signal having a duration responsive to the length of the burst, a fixed signal generating circuit for generating a fixed signal, and a selector circuit for selecting the data output signals or the fixed signal, according to the presence or absence of the envelope signal. Selection of the fixed signal between bursts prevents noise from being mistaken for data during periods when it is known that no data should be received.

DETAILED DESCRIPTION OF THE INVENTION

Figure 1:
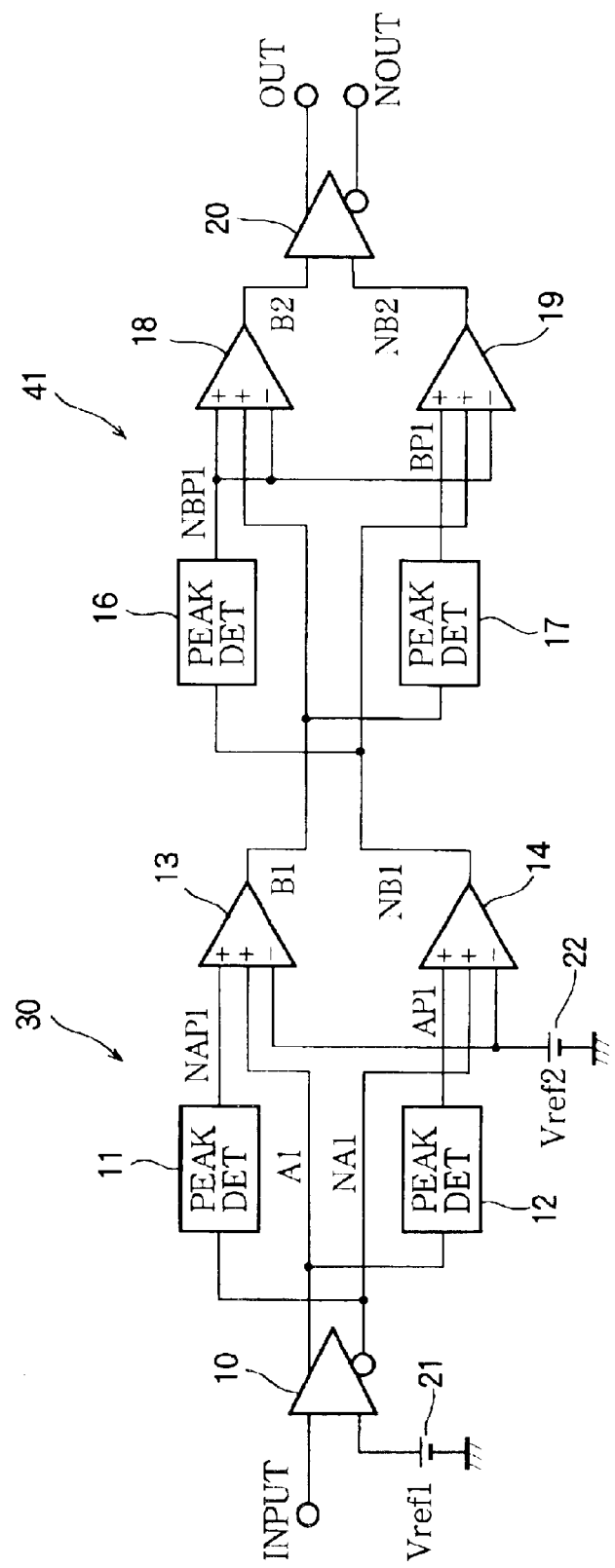
FIG. 1 shows the structure of a multistage level discrimination circuit according to a first embodiment of the present invention.

Embodiments of the invention will now be described with reference to the attached drawings, in which like elements are indicated by like reference characters.

First Embodiment

Figure 11:
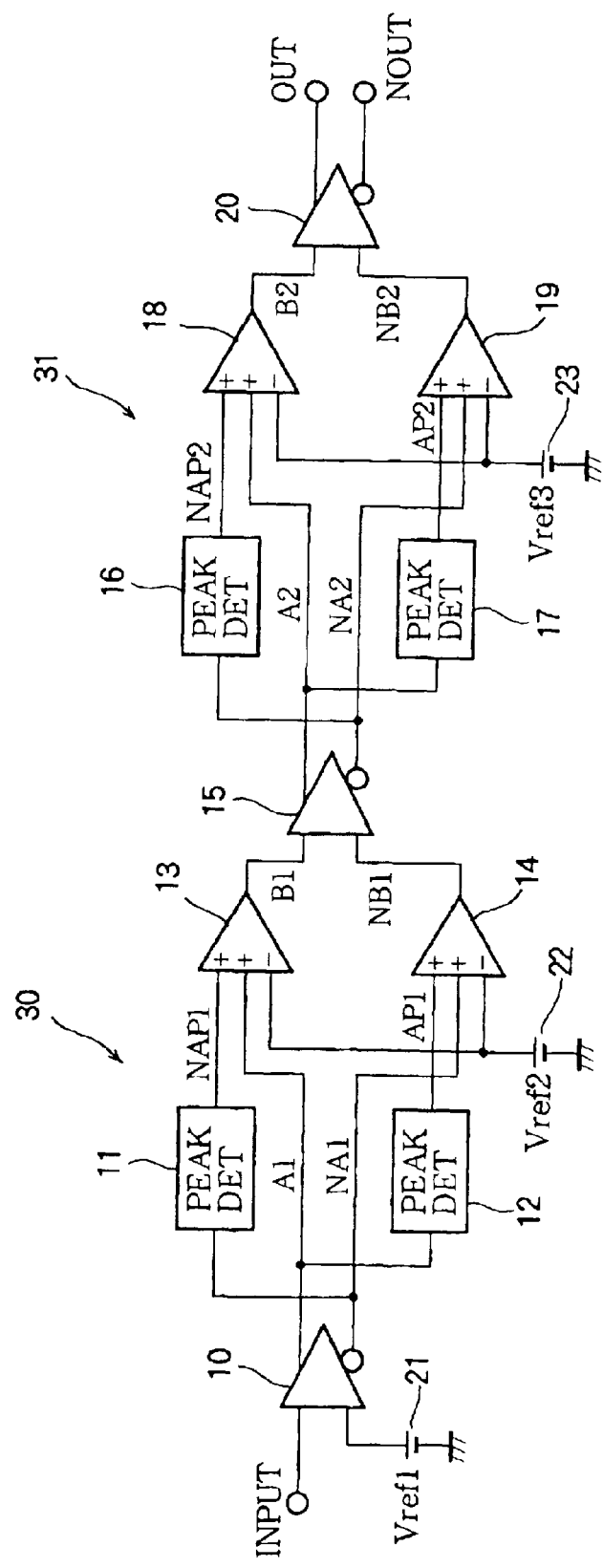
FIG. 11 shows the structure of a conventional multistage level discrimination circuit.
Figure 12:
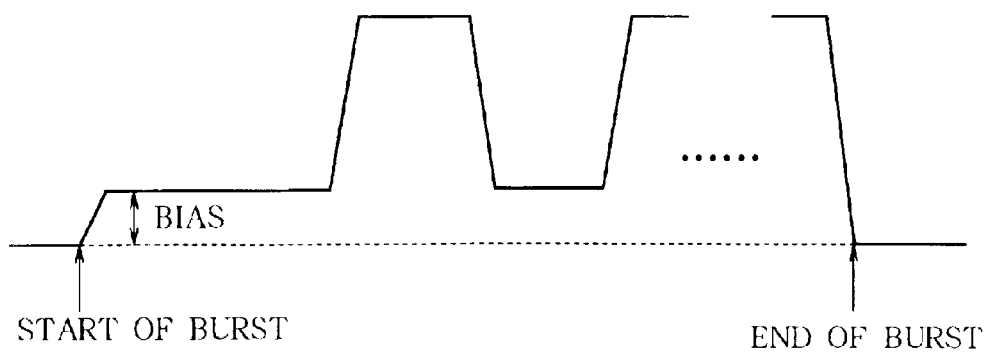
FIG. 12 shows how bias light is defined in a burst optical signal.
Figure 13:
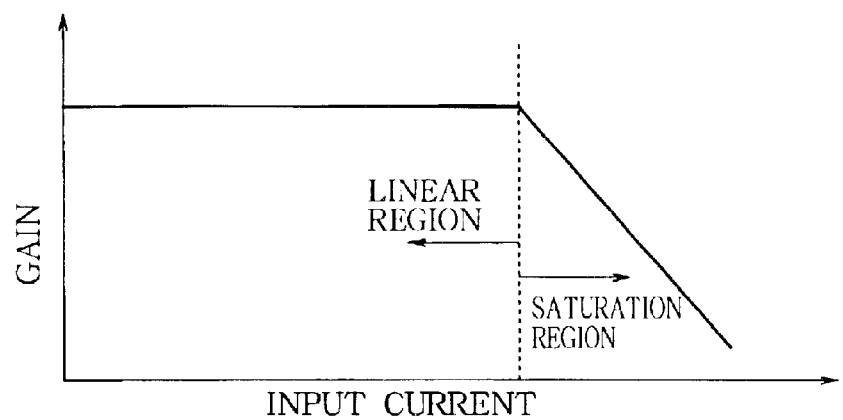
FIG. 13 schematically illustrates the gain characteristic of the preamplifier in FIG. 8.
Figure 14:
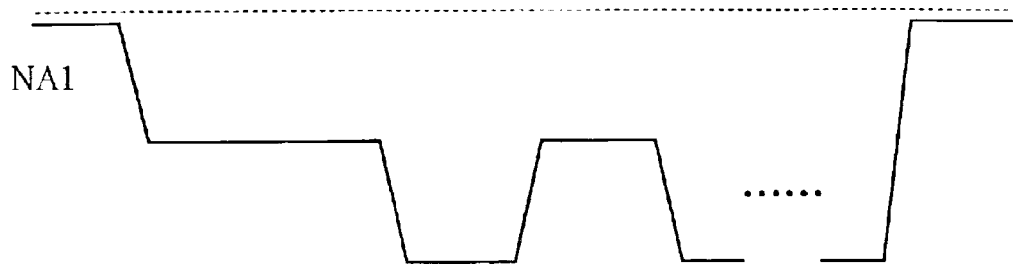
FIG. 14 shows a waveform of the negative-phase signal output from the preamplifier in FIG. 8 in response to a received optical signal burst including a large amount of bias optical power.
Figure 15:
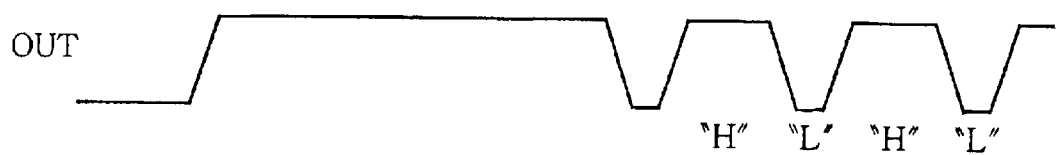
FIG. 15 shows a waveform output from a conventional level discrimination circuit when an optical signal burst including a large amount of bias optical power is received.
Figure 16:
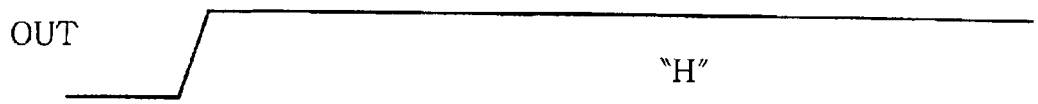
FIG. 16 shows a waveform output from a conventional level discrimination circuit when an optical signal burst including a very large amount of bias optical power is received.

FIG. 1 shows the structure of a multistage level discrimination circuit according to a first embodiment of the invention, using the same reference characters as in FIG. 11 for similar elements.

The level discrimination circuit in FIG. 1 comprises a differential amplifier 10, a firststage offset compensation circuit 30, a second-stage offset compensation circuit 41, and a comparator 20. The firststage offset compensation circuit 30 has the same circuit configuration as the first-stage offset compensation circuit 30 in the conventional serial multistage level discrimination circuit in FIG. 11. The second-stage offset compensation circuit 41 includes a pair of peak detection circuits 16, 17 and a pair of summing circuits 18, 19.

The second-stage offset compensation circuit 41 in the first embodiment differs from the conventional second-stage offset compensation circuit 31 by using the peak voltage NBP1 output from the third peak detection circuit 16 as the reference voltage for the summing circuits 18, 19.

Accordingly, no reference voltage source 23 (FIG. 11) is added to the second-stage offset compensation circuit 41.

The level discrimination circuit in the first embodiment does not include a second-stage differential amplifier 15. The positive-phase voltage B1 output from the first-stage offset compensation circuit 30 is input directly to summing circuit 18 and the fourth peak detection circuit 17, and the negative-phase voltage NB1 output from the first-stage offset compensation circuit 30 is input directly to summing circuit 19 and the third peak detection circuit 16.

FIGS. 2A to 2G and FIGS. 3A to 3G show signal and voltage waveforms in the level discrimination circuit according to the first embodiment. FIGS. 2A to 2G show waveforms when the input signal includes a bias Ioff (a dc offset due to bias light). FIGS. 3A to 3G show waveforms when the input signal has no bias Ioff.

Differential Amplifier 10

Figure 2A:
FIGS. 2A, 2B, 2C, 2D, 2E, 2F, and 2G show signal and voltage waveforms in the multistage level discrimination circuit in FIG. 1 when a dc bias Ioff is present.
Figure 2B:
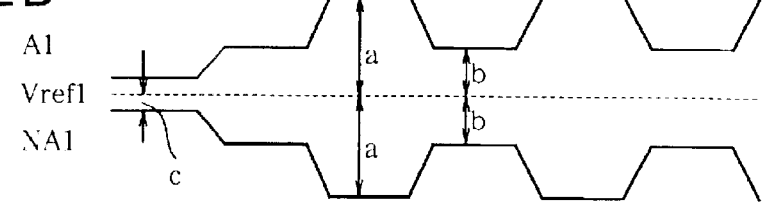
Figure 3A:
FIGS. 3A, 3B 3C, 3D, 3E, 3F, and 3G show signal and voltage waveforms in the multistage level discrimination circuit in FIG. 1 when no bias is present.
Figure 3B:
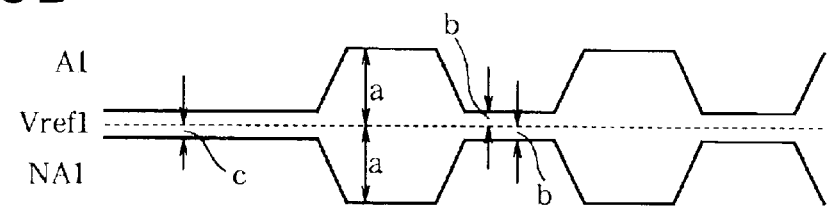
Figure 8:
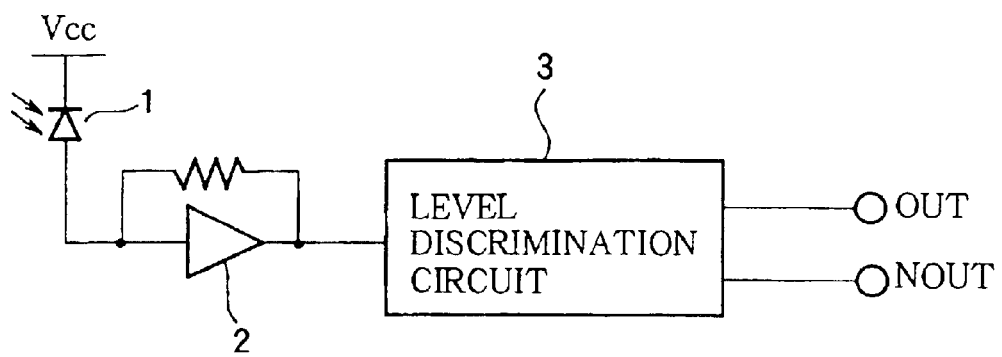
FIG. 8 shows the general structure of a burst optical signal receiving circuit.
Figure 9:
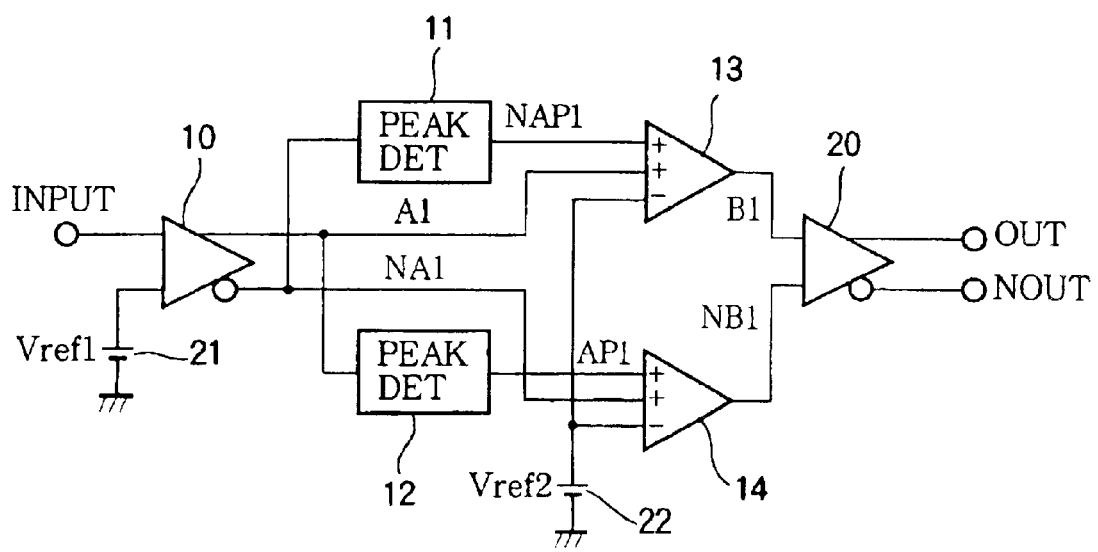
FIG. 9 shows the structure of a conventional level discrimination circuit.
Figure 10A:
FIGS. 10A, 10B, 10C, 10D, and 10E show signal and voltage waveforms in the conventional level discrimination circuit in FIG. 9.
Figure 10B:
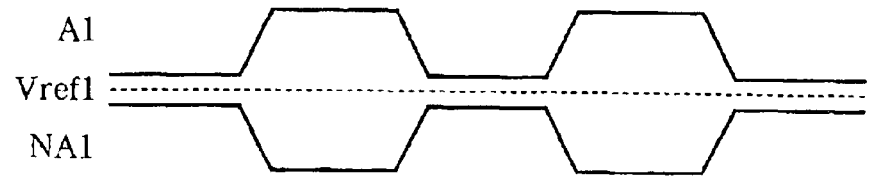
Figure 10C:
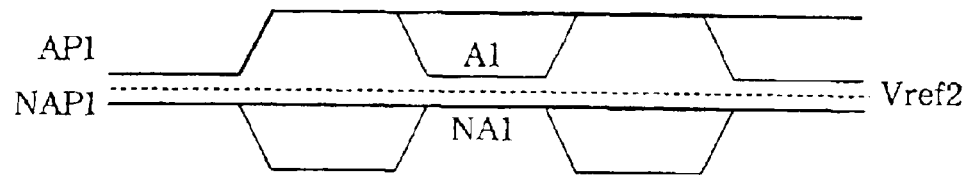
Figure 10D:
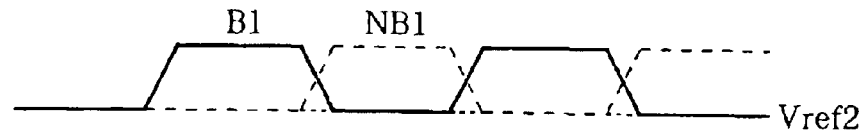
Figure 10E:
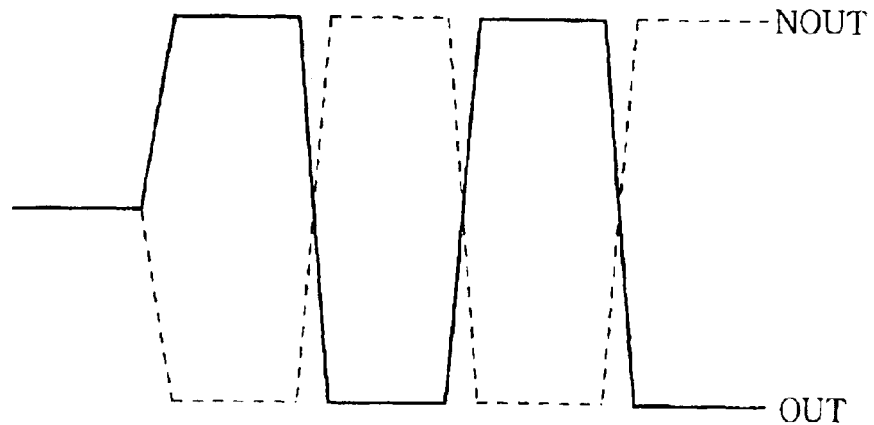

The differential amplifier 10 receives the signal marked INPUT from the preamplifier 2 (see FIG. 8) and a reference voltage Vref1 generated in reference voltage source 21 (see FIGS. 2A and 3A). The differential amplifier 10 receives the reference voltage Vref1 as its non-inverting input and the INPUT signal as its inverting input, and outputs a positive-phase differential voltage A1 and a negative-phase differential voltage NA1, which are positive and negative with respect to Vref1. The two output voltages A1 and NA1 have the same amplitude but opposite logic, as shown in FIGS. 2B and 3B.

Peak Detection Circuits 11, 12

In the first-stage offset compensation circuit 30, the first peak detection circuit 11 senses and outputs the peak voltage NAP1 of the negative differential voltage NA1. The second peak detection circuit 12 senses and outputs the peak voltage AP1 of the positive differential voltage A1 (see FIGS. 2C and 3C).

Summing Circuit 13

Summing circuit 13 receives the positive-phase voltage A1, the negative-phase peak voltage NAP1, and the reference voltage Vref2 generated by reference voltage source 22. Summing circuit 13 receives the positive-phase voltage A1 and negative-phase peak voltage NAP1 as non-inverting inputs and the reference voltage Vref2 as an inverting input, adds the positive-phase voltage A1 and the negative-phase peak voltage NAP1, using the reference voltage Vref2 as a reference, and outputs the sum as a positive-phase voltage B1 (see FIGS. 2D and 3D).

Summing Circuit 14

Summing circuit 14 receives the negative-phase voltage NA1, the positive-phase peak voltage AP1, and the reference voltage Vref2 generated in reference voltage source 22. Summing circuit 14 receives the negative-phase voltage NA1 and positive-phase peak voltage AP1 as non-inverting inputs and the reference voltage Vref2 as an inverting input, adds the negative-phase voltage NA1 and the positivephase peak voltage AP1, using the reference voltage Vref2 as a reference, and outputs the sum as a negative-phase voltage NB1 (see FIGS. 2D and 3D).

The positive-phase voltage B1 and the negative-phase voltage NB1 output from the summing circuits in the first-stage offset compensation circuit 30 are input directly to the second-stage offset compensation circuit 41.

Peak Detection Circuits 16, 17

In the second-stage offset compensation circuit 41, the third peak detection circuit 16 senses and outputs the peak voltage NBP1 of the negative-phase voltage NB1. The fourth peak detection circuit 17 senses and outputs the peak voltage BP1 of the positive-phase voltage B1 (see FIGS. 2E and 3E)

Summing Circuit 18

Summing circuit 18 receives the positive-phase voltage B1 and the negative-phase peak voltage NBP1. Summing circuit 18 receives the positive-phase voltage B1 and negative-phase peak voltage NBP1 as non-inverting inputs and also receives the negative-phase peak voltage NBP1 as an inverting input, adds the positive-phase voltage B1 and the negative-phase peak voltage NBP1, using the negative-phase peak voltage NBP1 as a reference, and outputs the sum as a positive-phase voltage B2 (see FIGS. 2F and 3F).

Summing Circuit 19

Summing circuit 19 receives the negative-phase voltage NB1, the positive-phase peak voltage BP1, and the negative-phase peak voltage NBP1. Summing circuit 19 receives the negative-phase voltage NB1 and positive-phase peak voltage BP1 as non-inverting inputs and the negative-phase peak voltage NBP1 as an inverting input, adds the negative-phase voltage NB1 and the positive-phase peak voltage BP1, using the negative-phase peak voltage NBP1 as a reference, and outputs the sum as a negative-phase voltage NB2 (see FIGS. 2F and 3F).

Comparator 20

Figure 2C:
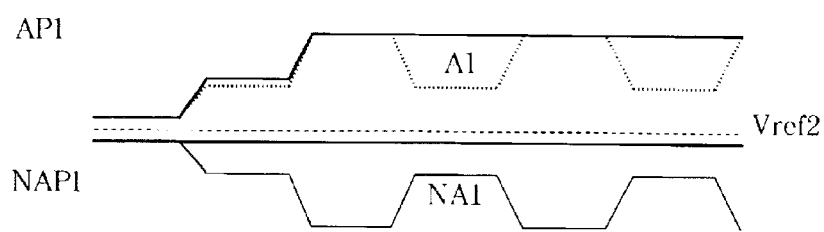
Figure 2D:
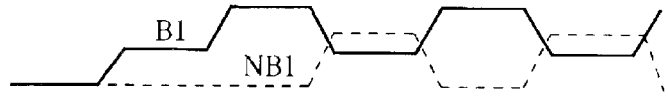
Figure 2E:
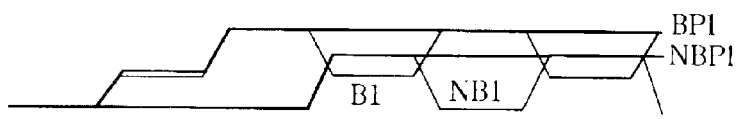
Figure 2G:
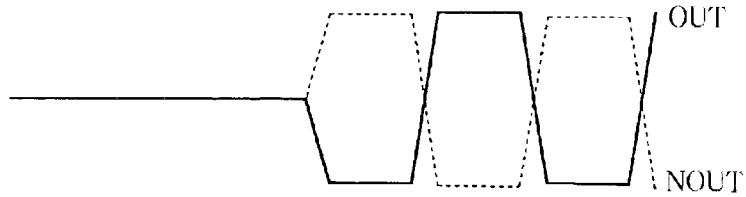
Figure 3C:
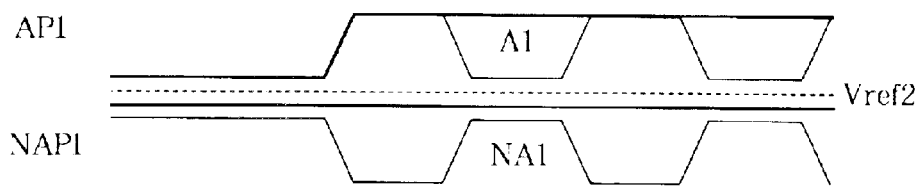

The comparator 20 receives the positive-phase voltage B2 and the negative-phase voltage NB2 output from the summing circuits in the second-stage offset compensation circuit 41. The comparator 20 receives the positive-phase voltage B2 as its non-inverting input and the negative-phase voltage NB2 as its inverting input, compares the level of voltage B2 with the level of voltage NB2, thereby discriminating the logic level of the received signal, and outputs a positive-phase received data signal OUT and a negative-phase received data signal NOUT with logic values of '1' (High) or '0' (Low), as shown in FIGS. 2G and 3G.

The positive-phase voltage B1 and the negative-phase voltage NB1 output from the first-stage offset compensation circuit 30 are described by the equations below:

$$B1 = k1(A1 + NAP1 - Vref2) \quad (1)$$

$$NB1 = k1(NA1 + AP1 - Vref2) \quad (2)$$

where k1 is a constant representing the gain of the summing circuits 13, 14.

The High level B1[H] and the Low level B1[L] of the positive-phase output voltage B1 are given by the equations below:

$$\begin{aligned} B1[H] &= k1(A1[H] + NAP1 - Vref2) \quad (3) \\ &= k1(Vref1 + a) + k1(Vref1 - c) - k1 \times Vref2 \\ &= k1(2Vref1 - Vref2) + k1(a - c) \\ &= Vref + Vpp + Voff \end{aligned}$$

-continued $$B1[L] = k1(A1[L] + NAP1 - Vref2) \quad (4)$$
$$= k1(Vref1 + b) + k1(Vref1 - c) - k1 \times Vref2$$
$$= k1(2Vref1 - Vref2) + k1(b - c)$$
$$= Vref + Voff$$

where k1(2Vref1−Vref2)=Vref, k1(a−b)=Vpp, and k1(b−c)=Voff.

The Low level NB1[L] and the High level NB1[H] of the negative-phase output voltage NB1 are given by the equations below.

$$NB1[L] = k1(NA1[L] + AP1 - Vref2) \quad (5)$$
$$= k1(Vref1 - a) + k1(Vref1 + a) - k1 \times Vref2$$
$$= k1(2Vref1 - Vref2)$$
$$= Vref$$

$$NB1[H] = k1(NA1[H] + AP1 - Vref2) \quad (6)$$
$$= k1(Vref1 - b) + k1(Vref1 + a) - k1 \times Vref2$$
$$= k1(2Vref1 - Vref2) + k1(a - b)$$
$$= Vref + Vpp$$

When the input signal includes no dc bias (as in FIG. 3A), the preamplified signals A1 and NA1 are also free of bias (b=c in FIG. 3B) and the peak voltage NAP1 is identical to the High level of the negative-phase voltage NA1 (although for clarity they are shown as differing slightly in FIG. 3C), so Voff=0 and the High level B1[H], the Low level B1[L]. the Low level NB1[L], and the High level NB1[H] are given by the equations below.

$$B1[H]=Vref+Vpp \quad (7)$$
$$B1[L]=Vref \quad (8)$$
$$NB1[L]=Vref \quad (9)$$
$$NB1[H]=Vref+Vpp \quad (10)$$

Figure 3D:
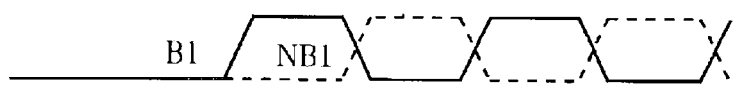

When the input signal does not include a dc bias, accordingly, the positive-phase voltage B1 and the negative-phase voltage NB1 output from the first-stage offset compensation circuit 30 have the same do level and amplitude but opposite logic during the signal burst, as shown in FIG. 3D.

When the input signal includes a bias Ioff, however, as shown in FIG. 2A, the peak voltage NAP1 is not identical to the High level of the negative-phase voltage NA1 (b≠c in FIG. 2B; NAP1 remains higher than the High level of NA1 as shown in FIG. 2C). Therefore, Voff is not zero, so the positive-phase voltage B1 and the negative-phase voltage NB1 output from the first-stage offset compensation circuit 30 have dc levels that deviate by Voff, as well as having opposite logic during the signal period, as shown in FIG. 2D.

In the first embodiment, however, the positive-phase voltage B1 and the negative-phase voltage NB1 output from the first-stage offset compensation circuit 30 are input directly to the second-stage offset compensation circuit 41, without being differentially amplified by a differential amplifier, and the dc offset is compensated for again in the second-stage offset compensation circuit 41, thereby obtaining a positive-phase voltage B2 and negative-phase voltage NB2 that have the same dc level and amplitude but opposite logic, and in which the duty cycle is not degraded, even if the input signal includes a bias Ioff.

The positive-phase voltage B2 and the negative-phase voltage NB2 output from the second-stage offset compensation circuit 41 are given by the equations below:

$$B2=k2(B1-NBP1-NBP1)=k2 \times B1 \quad (11)$$
$$NB2=k2(NB1+BP1-NBP1) \quad (12)$$

where k2 is the gain constant of summing circuits 18, 19.

The High level B2[H] and the Low level B2[L] of the positive-phase output voltage B2 are given by the equations below.

$$B2[H]=k2 \times B1[H]=k2(Vref+Vpp+Voff) \quad (13)$$
$$B2[L]=k2 \times B1[L]=k2(Vref+Voff) \quad (14)$$

The Low level NB2[L] and the High level N82[H] of the negative-phase output voltage NB2 are given by the equations below.

$$NB2[L] = k2(NB1[L] + BP1 - NBP1) \quad (15)$$
$$= k2(NB1[L] = B1[H] - NB1[H])$$
$$= k2(Vref + Voff)$$

$$NB2[H] = k2(NB1[H] + BP1 - NBP1) \quad (16)$$
$$= k2 \times BP1$$
$$= k2 \times B1[H]$$
$$= k2(Vref + Vpp + Voff)$$

Figure 2F:
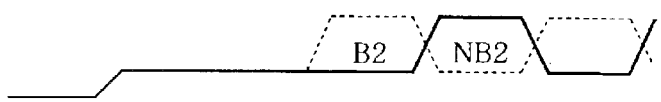
Figure 3E:
Figure 3F:
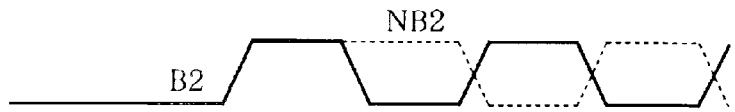
Figure 3G:
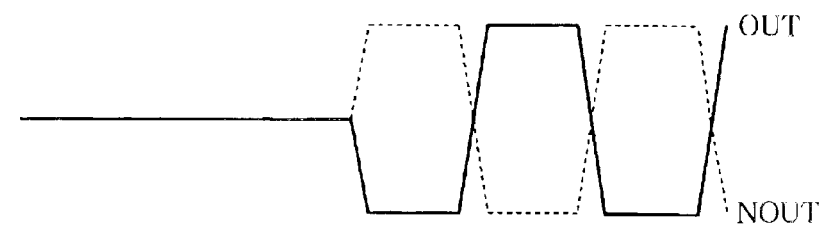

These equations (13) to (16) demonstrate that the second-stage differential output signals B2 and NB2 always have the same High and Low levels as shown in FIGS. 2F and 3F. This is because the peak level of negative-phase signal NB1 is always detected correctly, as shown in FIGS. 2E and 3E.

If there is no bias Ioff in the input signal, incidentally, then Voff=0 and the B2[H], B2[L], NB2[L], and NB2[H] levels are given by the equations below.

$$B2[H]=k2(Vref+Vpp) \quad (17)$$
$$B2[L]=k2 \times Vref \quad (18)$$
$$NB2[L]=k2 \times Vref \quad (19)$$
$$NB2[H]=k2(Vref+Vpp) \quad (20)$$

As described above, the positive-phase voltage B1 and the negative-phase voltage NB1 output from the first-stage offset compensation circuit 30 are input directly to the second-stage offset compensation circuit 41, which compensates again for dc offset, thereby obtaining a positive-phase voltage B2 and negative-phase voltage NB2 that have the same dc level and amplitude but opposite logic, even if the first-stage input signal includes a bias Ioff. Since the duty cycle of the first-stage voltages B1 and NB1 is not degraded, the duty cycle of the second-stage voltages B2 and NB2 is not degraded. As a result, the positive-phase data signal OUT and negative-phase data signal NOUT also have the correct duty cycle, as illustrated in FIGS. 2G and 3G, and the '1' or '0' logic values of the received data can be correctly discriminated.

In the second-stage offset compensation circuit 41, the negative-phase peak voltage NBP1 is used as the reference voltage for summing circuits 18, 19, so the negative-phase voltage NB1 is shifted in the positive direction by an amount corresponding to the offset voltage to generate the negative-phase output voltage NB2. The offset voltage accordingly affects both the positive-phase voltage B1 and the negative-phase voltage NB1 in the same way, as shown in FIG. 2E.

In the first embodiment, since there is no differential amplifier preceding the second-stage offset compensation circuit 41, the reference voltage for summing circuits 18, 19 cannot be generated with reference to the operating voltage range of the preceding-stage differential amplifier as in a conventional level discrimination circuit. Without reference to the operating voltage range of the preceding-stage amplifier, it would normally be difficult to generate a reference voltage that enables summing circuits 18, 19 to operate reliably within their dynamic range.

In the first embodiment, however, since the negative-phase peak voltage NBP1 is used as the reference voltage for summing circuits 18, 19, the input range of summing circuit 18 is equal to the output range of summing circuit 13, and the output range of summing circuit 18 is k2 times the output range of summing circuit 13. Summing circuit 18 can be made to operate reliably within its dynamic range by suitable selection of the gain constants k1 and k2 of summing circuits 13 and 18. During each received data burst, summing circuit 19 has the same output range as summing circuit 18, so summing circuit 19 will also operate reliably within its dynamic range.

In the first embodiment, the first bit of the received data is erased as shown in FIGS. 2G and 3G, but when a burst optical signal is received, it generally includes a one-byte preamble of alternating 1's and 0's, as specified in Recommendation G.983.1 of the Telecommunication Standardization Sector of the International Telecommunication Union (ITU-T), for example, so erasing the first bit of the burst does not impair data recovery.

As described above, in the first embodiment, the positive-phase voltage B1 and the negative-phase voltage NB1 output from the first-stage offset compensation circuit 30 are input directly to the second-stage offset compensation circuit 41, thereby obtaining an accurate positive-phase data signal OUT and an accurate negative-phase data signal NOUT, in which the duty cycle is not degraded, even if the input signal includes a bias Ioff.

Furthermore, since the negative-phase peak voltage NBP1 is used as the reference voltage for the summing circuits 18, 19 in the second-stage offset compensation circuit 41, these summing circuits 18, 19 can easily be made to operate within their dynamic range.

Second Embodiment

Figure 4:
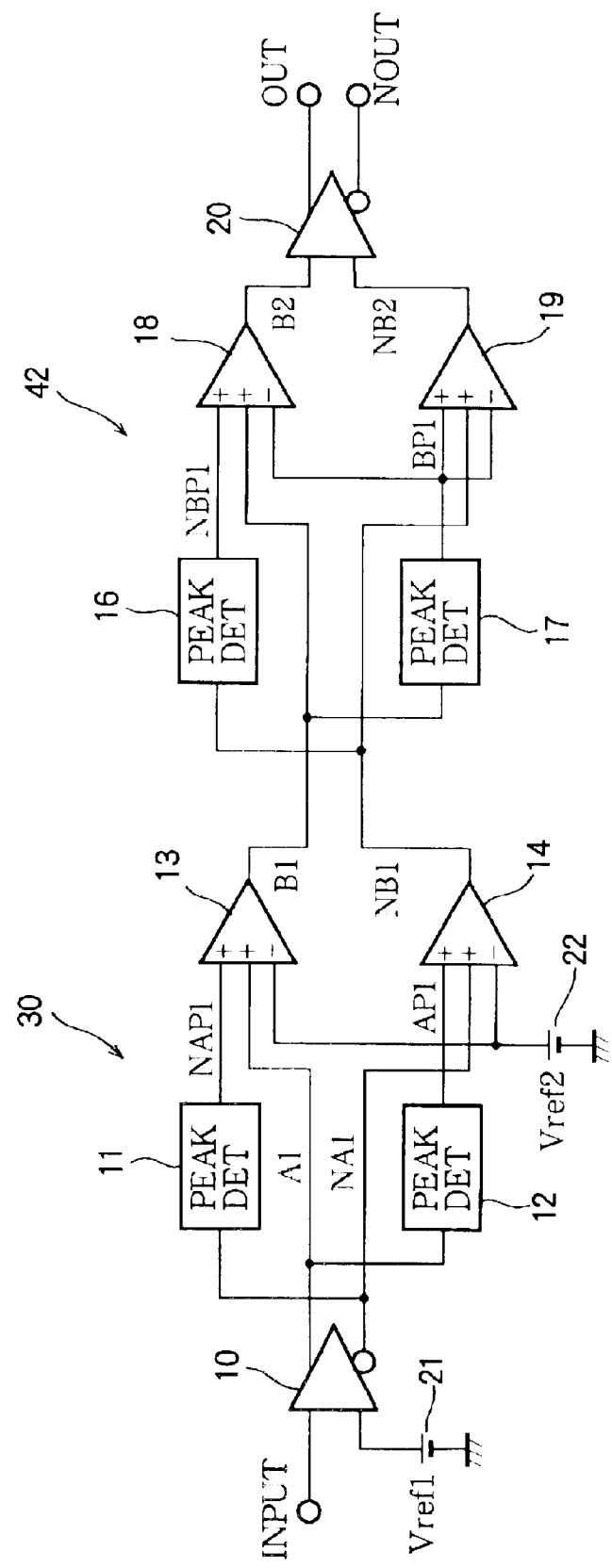
FIG. 4 shows the structure of a multistage level discrimination circuit according to a second embodiment of the invention.

FIG. 4 shows the structure of a multistage level discrimination circuit according to a second embodiment of the invention, using the same reference characters as in FIG. 1 for similar elements.

The multistage level discrimination circuit in FIG. 4 comprises a first-stage offset compensation circuit 30, a second-stage offset compensation circuit 42, and a comparator 20. The second-stage offset compensation circuit 42 differs from the second-stage offset compensation circuit 41 in the first embodiment (FIG. 1) by using the positive phase peak voltage BP1, instead of the negative-phase peak voltage NBP1, as the reference voltage for the summing circuits 18, 19.

FIGS. 5A to 5G and FIGS. 6A to 6G show signal and voltage waveforms in the second embodiment. FIGS. 5A to 5G show waveforms when the input signal includes a bias Ioff. FIGS. 6A to 6G show waveforms when the input signal has no bias Ioff. The waveforms in FIGS. 5A to 5E, and FIG. 5G are the same as the waveforms in FIGS. 2A to 2E, and FIG. 2G in the first embodiment. The waveforms in FIGS. 6A to 6E, and FIG. 6G are the same as the waveforms in FIG. 3A to FIG. 3E, and FIG. 3G in the first embodiment.

In the second-stage offset compensation circuit 42, summing circuit 18 receives the positive-phase voltage B1, the negative-phase peak voltage NBP1, and the positive-phase peak voltage BP1. Summing circuit 18 receives the positive-phase voltage B1 and negative-phase peak voltage NBP1 as non-inverting inputs and the positive-phase peak voltage BP1 as an inverting input, adds the positive-phase voltage B1 and the negative-phase peak voltage NBP1, using the positive-phase peak voltage BP1 as a reference, and outputs the sum as a positive-phase voltage B2 (see FIGS. 5F and 6F).

Summing circuit 19 receives the negative-phase voltage NB1 and the positive-phase peak voltage BP1. Summing circuit 19 receives these voltages NB1 and BP1 as non-inverting inputs, also receives the positive-phase peak voltage BP1 as an inverting input, adds the negative-phase voltage NB1 and the positive-phase peak voltage BP1, using the positive-phase peak voltage BP1 as a reference, and outputs the sum as a negative-phase voltage NB2 (see FIGS. 5F and 6F).

The positive-phase voltage B2 and the negative-phase voltage NB2 output from the second-stage offset compensation circuit 42 are given by the equations below.

$$B2 = k2(B1 + NBP1 - BP1) \tag{21}$$

$$NB2 = k2(NB1 + BP1 - BP1) = k2 \times NB1 \tag{22}$$

The High level B2[H] and the Low level B2[L] of the positive-phase output voltage B2 are given by the equations below.

$$\begin{aligned} B2[H] &= k2(B1[H] + NBP1 - BP1) \\ &= k2 \times NBP1 \\ &= k2 \times NB1[H] \\ &= k2(Vref + Vpp) \end{aligned} \tag{23}$$

$$\begin{aligned} B2[L] &= k2(B1[L] + NBP1 - BP1) \\ &= k2(B1[L] + NB1[H] - B1[H]) \\ &= k2 \times Vref \end{aligned} \tag{24}$$

The Low level NB2[L] and the High level NB2[H] of the negative-phase output voltage NB2 are given by the equations below.

$$NB2[L] = k2 \times NB1[L] = k2 \times Vref \tag{25}$$

$$NB2[H] = k2 \times NB1[H] = k2(Vref + Vpp) \tag{26}$$

Figure 5A:
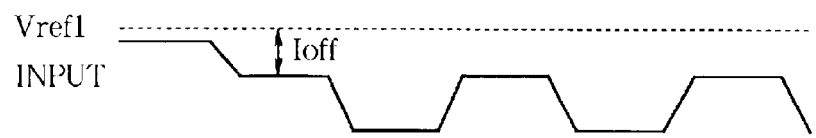
FIGS. 5A, 5B, 5C, 5D, 5E, 5F, and 5G show signal and voltage waveforms in the multistage level discrimination circuit in FIG. 4 when a do bias Ioff is present.
Figure 5B:
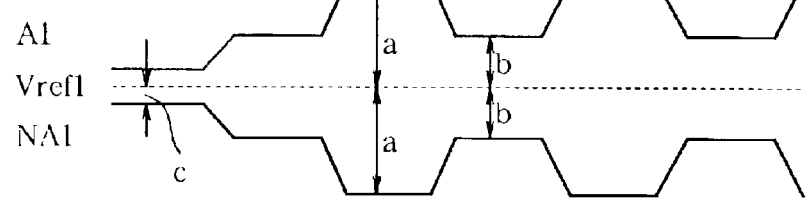
Figure 5C:
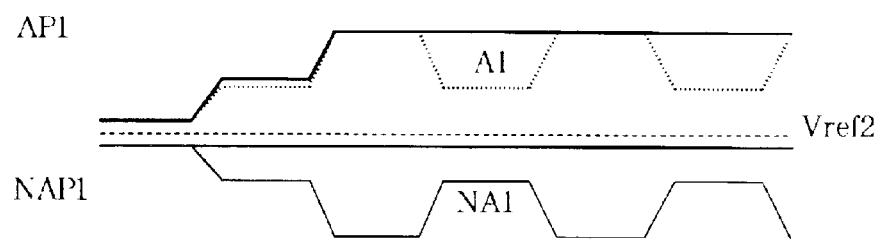
Figure 5D:
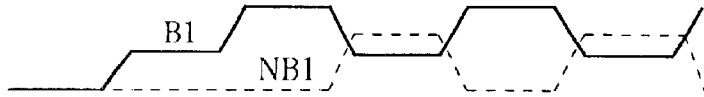
Figure 5E:
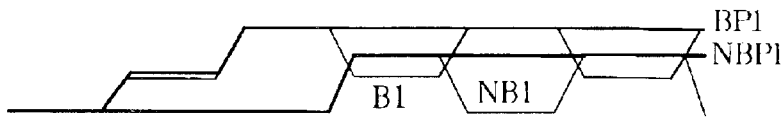
Figure 5F:
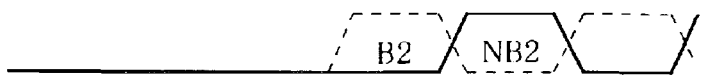
Figure 6A:
FIGS. 6A, 6B, 6C, 6D, 6E, 6F, and 6G show signal and voltage waveforms in the multistage level discrimination circuit in FIG. 4 when no bias is present.
Figure 6B:
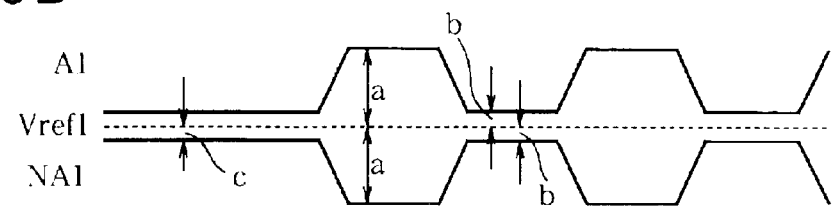
Figure 6C:
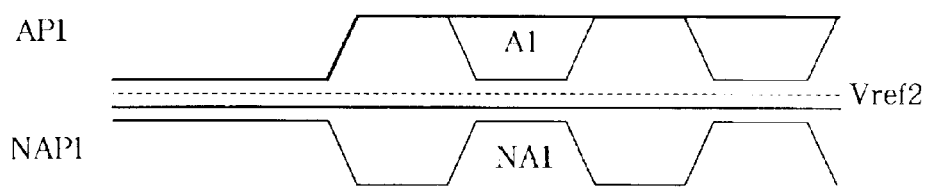
Figure 6D:
Figure 6E:
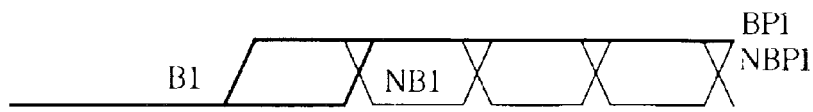
Figure 6F:
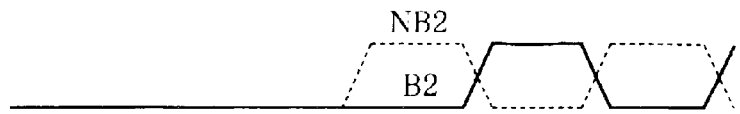

As in the first embodiment, the peak level of negative-phase signal NB1 is always detected correctly, as shown in FIGS. 5E and 6E, so the positive-phase output voltage B2 and the negative-phase output voltage NB2 have the same High and Low levels, as shown in FIGS. 5F and 6F.

When there is no bias Ioff in the input signal, so that Voff=0, the B2[H], B2[L], NB2[L], and NB2[H] levels are given by the equations below.

$$B2[H] = k2(Vref + Vpp) \tag{27}$$

$$B2[L] = k2 \times Vref \tag{28}$$

$$NB2[L] = k2 \times Vref \tag{29}$$

$$NB2[H] = k2(Vref + Vpp) \tag{30}$$

Figure 5G:
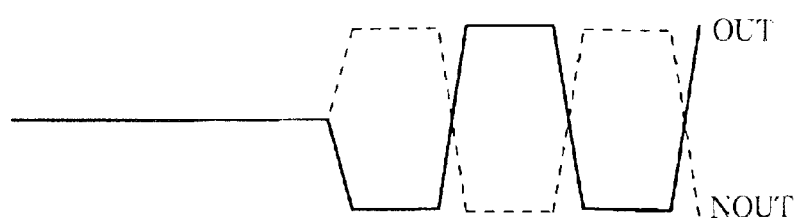
Figure 6G:
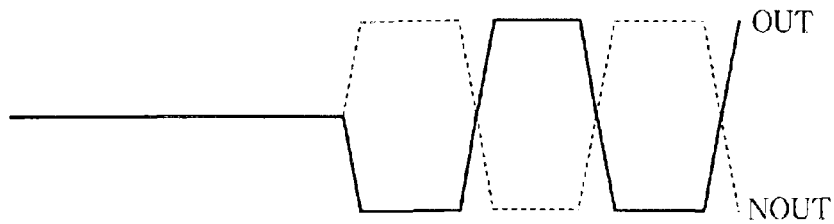

As described above, even if the input signal includes a bias Ioff, a positive-phase voltage B2 and negative-phase voltage NB2 that have the same dc level and amplitude but opposite logic, and in which the duty cycle is not degraded, are obtained as in the first embodiment, so an accurate positive-phase data signal OUT and an accurate negative-phase data signal NOUT, in which the duty cycle is not degraded, are obtained, as shown in FIGS. 5G and 6G, and the '1' or '0' logic values of the received data can be correctly discriminated.

In the first embodiment, in which the negative-phase peak voltage NBP1 is used as the reference voltage for the summing circuits 18, 19 in the second-stage offset compensation circuit 41, the negative-phase voltage NB1 is shifted in the positive direction by an amount corresponding to the offset voltage. In the second embodiment, since the positive-phase peak voltage BP1 is used as the reference voltage for these summing circuits 18, 19, the positive-phase voltage B1 is shifted in the negative direction by an amount corresponding to the offset voltage to generate the positive-phase output voltage B2. The result is still that the offset voltage affects both the positive-phase voltage B1 and the negative-phase voltage NB1 alike, as shown in FIG. 5E.

In the second embodiment, since the positive-phase peak voltage BP1 is used as the reference voltage for summing circuits 18, 19, these circuits can easily be made to operate within their dynamic range by suitable selection of the gain constants k1, k2, as explained in the first embodiment.

In the second embodiment, the first bit of the received data is erased as shown in FIG. 5G and FIG. 6G, but this causes no problems in data recovery, for the reason noted in the first embodiment.

As described above, in the second embodiment, the positive-phase voltage B1 and the negative-phase voltage NB1 output from the first-stage offset compensation circuit 30 are input directly to the second-stage offset compensation circuit 42, thereby obtaining an accurate positive-phase data signal OUT and an accurate negative-phase data signal NOUT, in which the duty cycle is not degraded, even if the input signal includes a bias Ioff, as in the first embodiment.

Furthermore, the positive-phase peak voltage BP1 is used as the reference voltage for summing circuits 18, 19 in the second-stage offset compensation circuit 42, so summing circuits 18, 19 can operate reliably within their dynamic range, as in the first embodiment.

Third Embodiment

Figure 7:
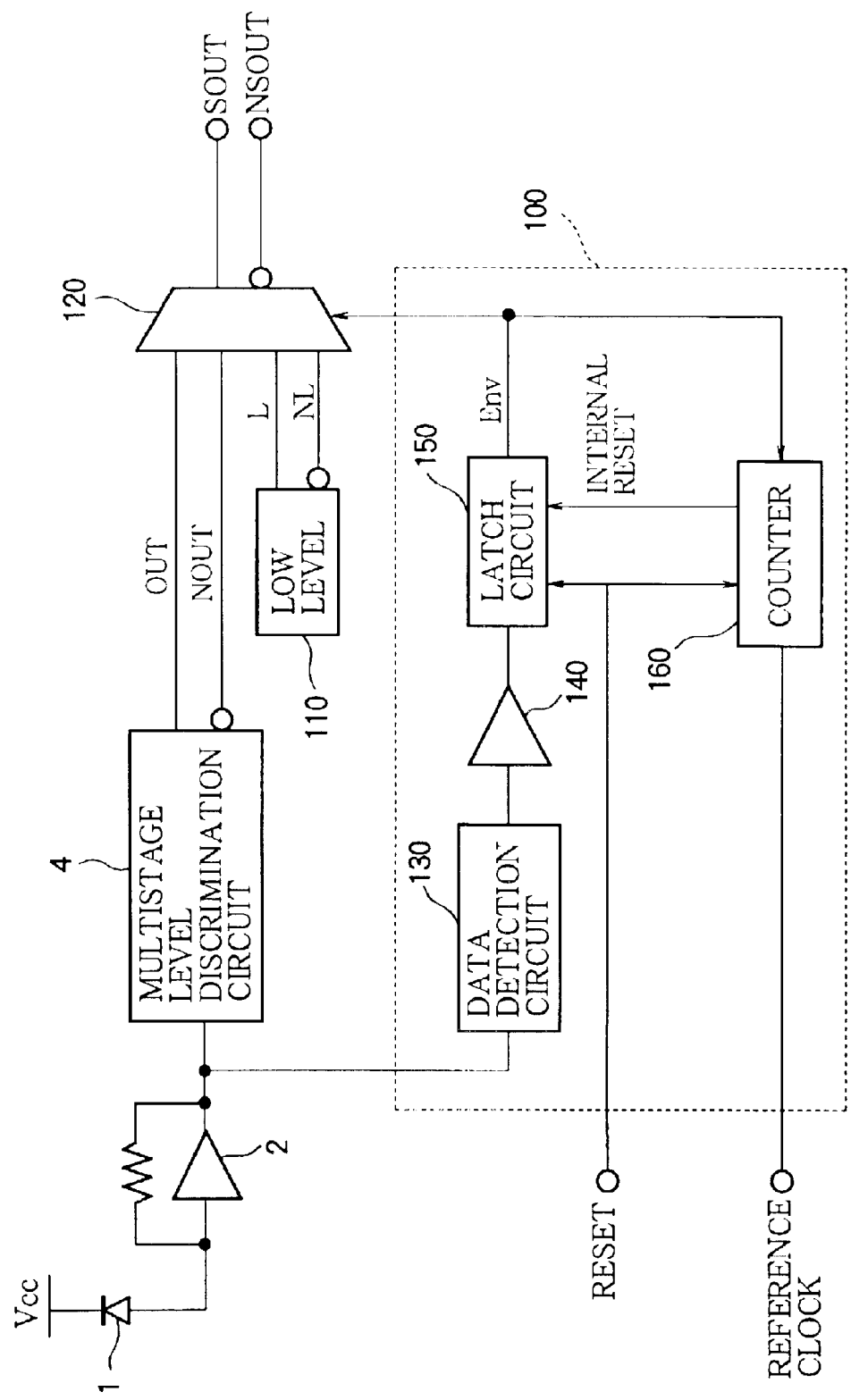
FIG. 7 shows the structure of a burst optical signal receiving circuit including a level discrimination circuit according to a third embodiment of the invention.

FIG. 7 shows the general structure of a level discrimination circuit according to a third embodiment of the invention. The level discrimination circuit in FIG. 7 comprises a photodiode 1, a preamplifier 2, a multistage level discrimination circuit 4 of the type described in the first or second embodiment, an envelope signal generating circuit 100, a Low level output circuit 110, and a selector 120. The level discrimination circuit in FIG. 7 differs from the multistage level discrimination circuits in the first and second embodiments by removing noise during periods in which no signal is received.

Photodiode 1

The photodiode 1 receives a burst optical signal transmitted from an optical signal transmitting circuit (not shown), converts the received optical signal to photocurrent, and outputs the photocurrent to the preamplifier 2.

Preamplifier 2

The preamplifier 2 converts the photocurrent to a voltage signal, and outputs the voltage signal to the multistage level discrimination circuit 4 and the envelope signal generating circuit 100.

Envelope Signal Generating Circuit 100

The envelope signal generating circuit 100 comprises a data detection circuit 130, a limiter amplifier 140, a latch circuit 150, and a counter 160. The envelope signal generating circuit 100 senses the start of the reception of the burst optical signal from the preamplified signal input from the preamplifier 2. When the start of an optical signal burst is recognized, the envelope signal generating circuit 100 generates an envelope (Env) signal having a duration corresponding to the receiving period of the burst (the signal period), and outputs the Env signal to the selector 120. The Env signal is output for a period including the entire signal period of the burst. The Env signal is generated for a period predetermined so as to include the entire burst reception period. The envelope signal generating circuit 100 outputs the Env signal until a predetermined time has elapsed from the start of reception of the burst.

Low Level Output Circuit 110

The Low level output circuit 110 generates a pair of signals L, NL appropriate for output from the multistage level discrimination circuit 4 when no signal is received, and supplies these signals L, NL to the selector 120. Signal L is a Low level signal; signal NL is the inverted version of the signal L and is thus a High level signal. Since L and NL both represent the '0' data state, they will be referred to collectively as a pair of Low-level signals.

Selector 120

The selector 120 receives the Env signal from the envelope signal generating circuit 100. When the Env signal is High, the selector 120 selects the ATC signals OUT, NOUT output from the multistage level discrimination circuit 4; when the Env signal is Low, the selector 120 selects the Low-level signals L, NL received from the Low level output circuit 110. The selected signals are output as signals SOUT, NSOUT.

Data Detection Circuit 130

In the envelope signal generating circuit 100, the data detection circuit 130 senses the first bit of the burst optical signal (the first High level data), and outputs a data detection signal to the limiter amplifier 140. More specifically, the data detection circuit 130 senses the start of the reception of the burst optical signal, and outputs the data detection signal as a signal indicating the start of data reception.

Limiter Amplifier 140

The limiter amplifier 140 amplifies the input data detection signal to an amplitude level at which the latch circuit 150 can operate, and outputs the amplified data detection signal to the latch circuit 150.

Latch Circuit 150

The latch circuit 150 drives the Env signal to the High level over the duration between the input of the data detection signal and the input of an internal reset signal, and outputs the Env signal to the selector 120 and the counter 160. More specifically, when the start of the reception of the burst optical signal is detected the latch circuit 150 latches the amplified data detection signal, which indicates the start of reception, and starts the generation of the Env signal. When the internal reset signal is input from the counter 160, the latch circuit 150 is reset, and stops the generation of the Env signal. The latch circuit 150 is also reset when a reset signal is input from a reset input terminal.

Figure 17:
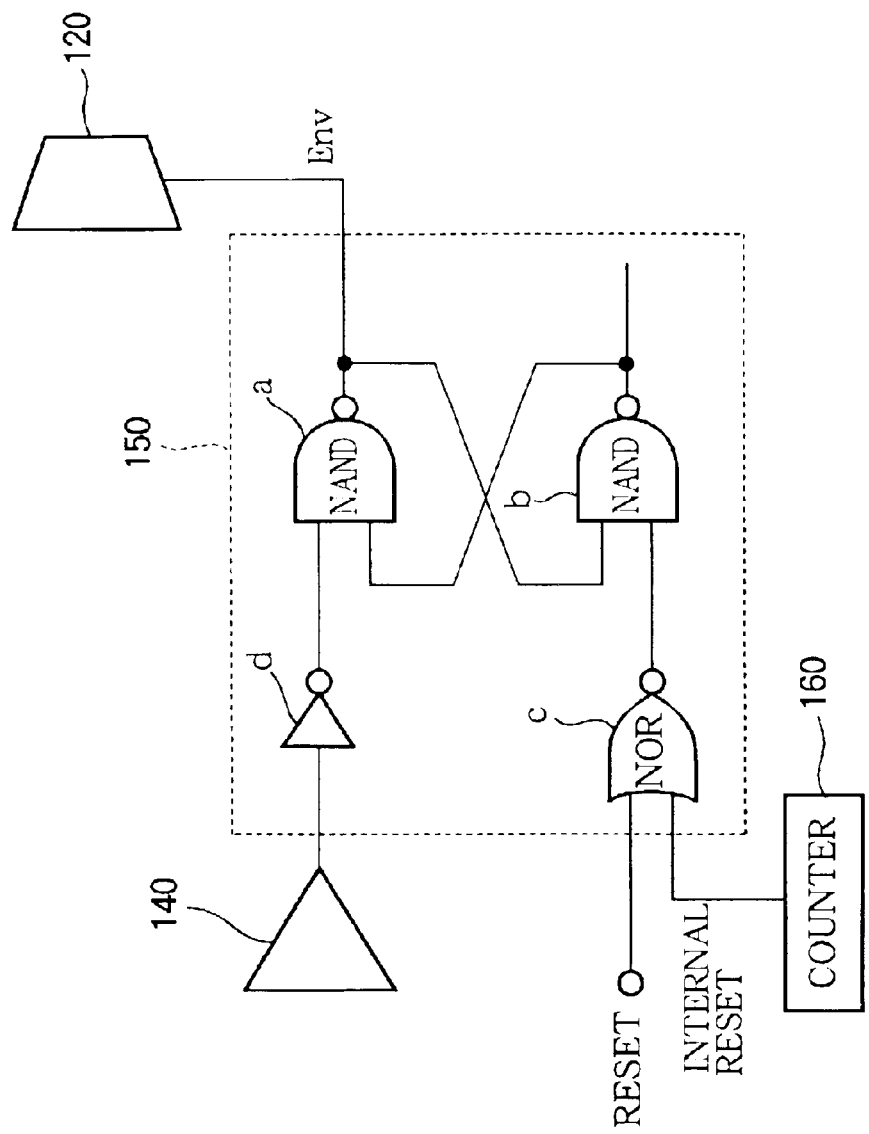
FIG. 17 shows an example of the internal structure of the latch circuit in FIG. 7.

FIG. 17 shows an example of the internal structure of the latch circuit 150. In this example the latch circuit 150 is structured as an asynchronous setreset flip-flop (SR-F/F) comprising a pair of two-input NAND gates (a and b), a two-input NOR gate (c). and an inverter (d). The latch circuit 150 receives the signal output from the limiter amplifier 140 as its set input, and receives the internal reset signal from the counter 160 and the reset signal from the reset input terminal as reset inputs.

Counter 160

The counter 160 receives a reference clock signal from a clock input terminal as its clock input, receives the reset signal from the reset input terminal as its reset input, receives the Env signal from the latch circuit 150 as a count enable input, and counts cycles of the reference clock signal. When the count value reaches a predetermined value (referred to below as the internal reset value), the counter 160 outputs a carry signal as an internal reset signal to the latch circuit 150.

Figure 18:
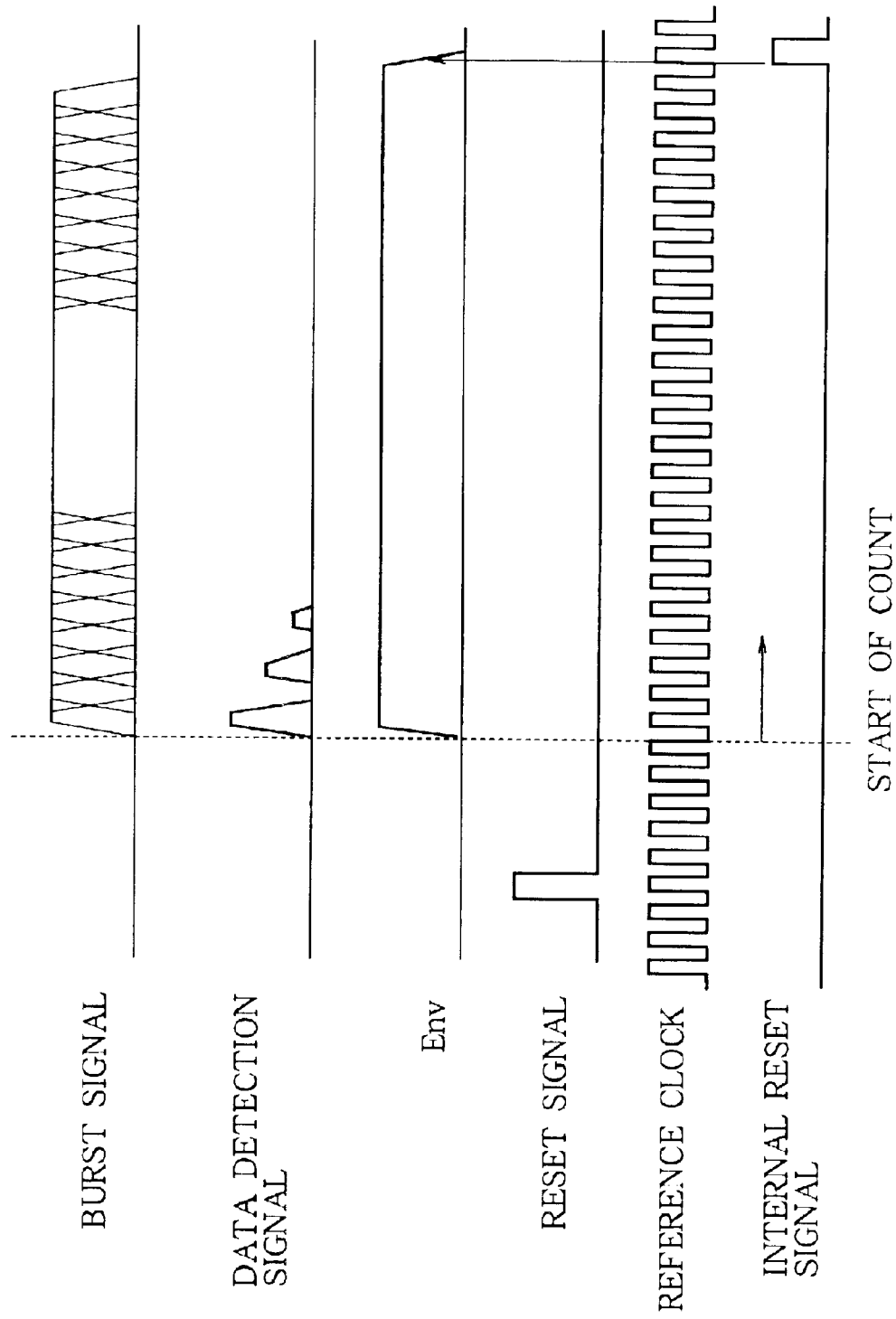
FIG. 18 is a timing diagram illustrating the operation of the envelope signal generating circuit in FIG. 7.

FIG. 18 is a timing diagram illustrating the operation of the envelope signal generating circuit 100 in the third embodiment. The operation of the level discrimination circuit in the third embodiment will be described below with reference to FIGS. 7, 17, and 18.

During the period preceding a burst, in which no optical signal is received, the amplified data detection signal output from the limiter amplifier 140 is Low. This Low-level data detection signal is input to the inverter (d) in the latch circuit 150 in FIG. 17. The reset signal and the internal reset signal input to the NOR gate (c) are Low at this time, so the level of the signals output from NAND gates (a and b) is indeterminate. The count value of the counter 160 is also indeterminate.

When a burst signal is sent and received, it is always sent and received as a packet preceded by a reset signal as shown in FIG. 18, the reset signal being input several bits before the packet begins. The reset signal resets the outputs of the NAND gates (a and b) in the latch circuit 150 to predetermined levels, halts the counting operation in the counter 160, and resets the count value in the counter 160.

When the High-level reset signal shown in FIG. 18 is input from the reset input terminal to the NOR gate (c) in the latch circuit 150 in FIG. 17, several bits before the burst packet begins, the amplified data detection signal output from the preamplifier 2 is Low, so the Env signal output from the first NAND gate (a) is forced Low.

The counter 160 resets its count value when the reset signal is input. The counting operation in the counter 160 remains halted while the Env signal is Low; the counter 160 counts only when the Env signal is High. Since the Env signal has been forced Low, the counting operation in the counter 160 remains in the halted state.

The selector 120 outputs the Low-level signals L, NL from the Low level output circuit 110 as signals SOUT, NSOUT for the duration of the Low-level Env signal; the selector 120 outputs the ATC signals OUT, NOUT as signals SOUT, NSOUT for the duration of the High-level Env signal. Accordingly, after the Env signal is forced Low, the selector 120 outputs the signals L, NL from the Low level output circuit 110 as signals SOUT, NSOUT.

When the transmission and reception of the burst optical signal starts, the burst signal shown in FIG. 18 is input to the data detection circuit 130, which senses the first bit of the burst signal and outputs the data detection signal shown in FIG. 18 to the limiter amplifier 140. The limiter amplifier 140 amplifies the input data detection signal and outputs a High-level data detection signal to the latch circuit 150.

The latch circuit 150 latches the High-level data detection signal output from the limiter amplifier 140, and outputs the High-level Env signal as shown in FIG. 18, the High-level output continuing until the internal reset signal is input. More specifically, when the High-level data detection signal from the limiter amplifier 140 is input to the inverter (d) in the latch circuit 150 in FIG. 17, the Env signal output from the first NAND gate (a) goes from the Low level to the High level. After the data detection signal returns to the Low level, the Env signal is held at the High level until the High-level internal reset signal is input to the NOR gate (c), at which point the Env signal returns to the Low level.

When the Env signal goes from the Low level to the High level, the counter 160 starts counting according to the reference clock signal shown in FIG. 18, and the selector 120 switches from output of the Low-level signals L, NL to output of the ATC signals OUT, NOUT as the selected output signals SOUT, NSOUT.

When the count value reaches the predetermined internal reset value, the counter 160 outputs a carry signal to the latch circuit 150 as the High-level internal reset signal shown in FIG. 18. The internal reset value is predetermined so that the internal reset signal is output after the completion of reception of the burst signal.

The latch circuit 150 is reset by the input internal reset signal, and stops the output of the Env signal. When the High-level internal reset signal is input to the NOR gate (c) in the latch circuit 150 in FIG. 17, the signal output from the second NAND gate (b) goes from the Low level to the High level. Since the signal output from the limiter amplifier 140 is already Low the Env signal output from the first NAND gate (a) goes from the High level to the Low level when the signal output from the second NAND gate (b) goes High.

When the Env signal goes from the High level to the Low level, the counter 160 stops counting, and the selector 120 switches from output of the ATC signals OUT, NOUT to output of the Low-level signals L, NL as the selected output signals SOUT, NSOUT.

As described above, when the reception of a burst signal is sensed in the third embodiment, the High-level Env signal is generated until a predetermined time has elapsed from the start of reception of the burst. For the duration of the High-level Env signal, the ATC signals OUT, NOUT are selected for output as signals SOUT, NSOUT; while the Env signal is low, the ATC signals OUT, NOUT are ignored, and the Low-level signals L, NL are output instead as SOUT and NSOUT.

Noise may occur in the signals OUT, NOUT output from the multistage level discrimination circuit 4 during the period in which no signal is received, due to comparator jitter, for example, or because the ATC signal NOUT discharges with a certain time constant after the completion of reception of a burst signal.

In the third embodiment, accordingly, the Env signal goes High and the ATC signals OUT, NOUT are selected during the receiving period of the burst signal; the Env signal goes Low and the Low-level signals L, NL are output during the no-signal periods in which the noise described above may occur, thereby avoiding output of the noise in the signal output from the multistage level discrimination circuit 4.

The data detection circuit 130 and the limiter amplifier 140 are provided to cause the Env signal to go High at the start of the reception of the burst signal; the counter 160 is provided to cause the Env signal to go Low.

When the Env signal goes High, the counter 160 starts counting. When the counter 160 counts up to a predetermined internal reset value, the counter 160 outputs an internal reset signal and resets the latch circuit 150, so the Env signal goes Low. Accordingly, in the third embodiment, the Env signal remains High for a predetermined period from the time when the counter 160 starts counting until the count value reaches the internal reset value.

The Env signal must go Low after the completion of reception of a burst signal and before the occurrence of noise in the signal output from the multistage level discrimination circuit 4. An internal reset value satisfying this requirement must be set in the counter 160. If the packet length of a burst is fixed, this requirement can be satisfied simply by determining the internal reset value according to the packet length.

As described above, according to the third embodiment, the High-level Env signal is generated for a predetermined period according to the packet length of a burst signal from the start of reception of the burst. The Env signal goes High and the ATC signals OUT, NOUT are selected during the receiving period of the burst; the Env signal goes Low and the Low-level signals L. NL are output during no-signal periods, thereby removing the noise which occurs during the no-signal periods.

Since it is unnecessary to include an offset voltage in the multistage level discrimination circuit for avoiding the occurrence of noise described above, adequate level discrimination time and adequate photosensitivity can be ensured, thereby enabling the logic levels of a signal near the minimum light receiving level to be discriminated. The result is a performance improvement including enhanced light-receiving sensitivity and a widened receiving dynamic range, enabling an optical communication system of high quality to be constructed.

Fourth Embodiment

Figure 19:
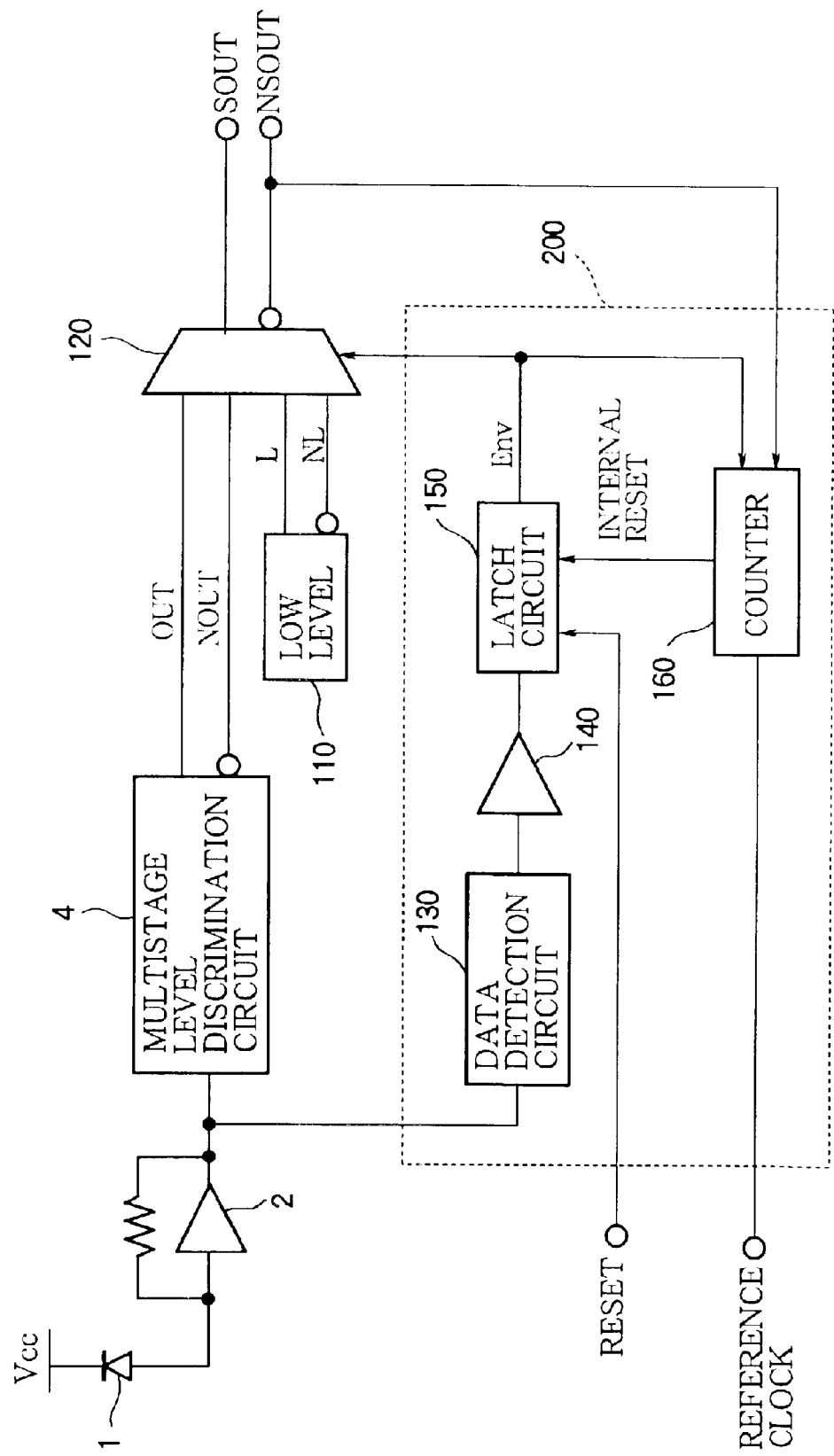
FIG. 19 shows the structure of a burst optical signal receiving circuit including a level discrimination circuit according to a fourth embodiment of the invention.

FIG. 19 shows the general structure of a level discrimination circuit according to a fourth embodiment of the invention, using the same reference characters as in FIG. 7 for similar elements. The level discrimination circuit in FIG. 19 comprises a photodiode 1, a preamplifier 2, a multistage level discrimination circuit 4 of the type described in the first or second embodiment, a Low level output circuit 110, a selector 120, and an envelope signal generating circuit 200. The level discrimination circuit in FIG. 19 differs from the multistage level discrimination circuit in the third embodiment (see FIG. 7) only in regard to the envelope signal generating circuit.

Envelope Signal Generating Circuit 200

Envelope signal generating circuit 200 comprises a data detection circuit 130, a limiter amplifier 140, a latch circuit 150, and a counter 160. The envelope signal generating circuit 200 senses the start of the reception of the burst optical signal from the preamplified signal input from the preamplifier 2. When the start of an optical signal burst is recognized, the envelope signal generating circuit 200 generates an envelope (Env) signal having a duration corresponding to the receiving period of the burst (the signal period), and outputs the Env signal to the selector 120. The Env signal is output for a period including the entire signal period of the burst, the period being variable according to the packet length of the burst. More specifically, the duration of the Env signal is varied according to the NSOUT signal output from the selector 120. The envelope signal generating circuit 200 outputs the Env signal from the start of reception of the burst until the NSOUT signal (which is generated from the signal NOUT output from the multistage level discrimination circuit 4) has remained Low for a predetermined time.

The difference from the envelope signal generating circuit 100 in the third embodiment is that the envelope signal generating circuit 200 in FIG. 19 is structured to detect the completion of reception by using the NSOUT signal from the selector 120 as a (count) reset signal for the counter 160. The reset signal from the reset input terminal is therefore input only to the latch circuit 150, instead of being input to both the latch circuit 150 and the counter 160 as in the third embodiment.

In the envelope signal generating circuit 200, the counter 160 receives a reference clock signal from a clock input terminal as its clock input, receives the count reset signal from the selector 120 as its reset input, receives the Env signal from the latch circuit 150 as a count enable input, and counts cycles of the reference clock signal. When the count value reaches a predetermined internal reset value, the counter 160 outputs a carry signal as an internal reset signal to the latch circuit 150.

Figure 20:
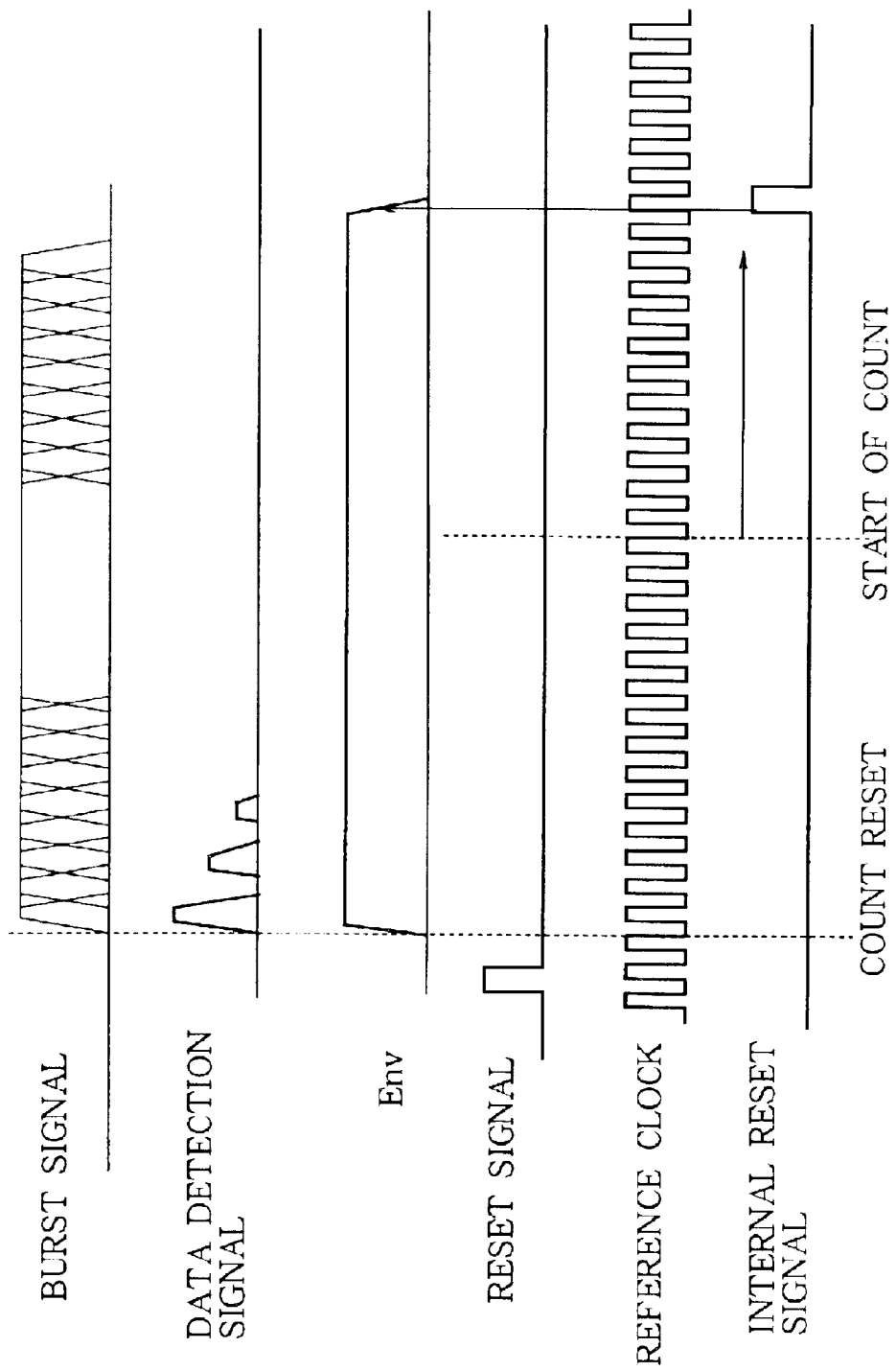
FIG. 20 is a timing diagram illustrating the operation of the envelope signal generating circuit in FIG. 19.

FIG. 20 is a timing diagram illustrating the operation of the envelope signal generating circuit 200 in the fourth embodiment. The operation of the level discrimination circuit in the fourth embodiment will be described below with reference to FIGS. 19 and 20.

When the High-level reset signal shown in FIG. 20 is input to the reset input terminal, several bits before the burst packet begins, the latch circuit 150 is reset, and the Env signal is forced Low, as in the third embodiment. When the Env signal is forced Low, the counting operation in the counter 160 halts and remains halted until the Env signal goes High. The selector 120 outputs the Low-level signals L, NL as signals SOUT, NSOUT.

When the transmission and reception of the burst optical signal starts, and the burst signal shown in FIG. 20 is input to the data detection circuit 130, the Env signal goes from the Low level to the High level as described in the third embodiment: the data detection circuit 130 senses the first bit of the burst signal and outputs the data detection signal shown in FIG. 20 to the limiter amplifier 140; the limiter amplifier 140 amplifies the input data detection signal and outputs the amplified data detection signal to the latch circuit 150; the latch circuit 150 latches the amplified data detection signal received from the limiter amplifier 140, and outputs the High-level Env signal until the internal reset signal shown in FIG. 20 is input.

When the Env signal goes from the Low level to the High level, the selector 120 switches to output of the ATC signals OUT, NOUT as the selected output signals SOUT, NSOUT, as in the third embodiment, and supplies the NSOUT output signal as a count reset signal to the counter 160.

The counter 160 can start counting when the Env signal goes from the Low level to the High level. The selected output signal NSOUT, however, is input as a count reset signal substantially simultaneously with this logic transition of the Env signal. The counter 160 is reset each time a High-level NSOUT signal is input. During the transmission and reception of the burst signal, these High-level NSOUT inputs occur frequently enough that the count value never reaches the internal reset value, so the counter 160 does not output an internal reset signal.

When the transmission and reception of the burst signal is finished, no count reset signal is input to the counter 160 (the count reset signal remains Low), so the counter 160 continues counting without being reset. When the count value reaches the internal reset value, the counter 160 outputs a carry signal as the High-level internal reset signal shown in FIG. 20 to the latch circuit 150.

As in the third embodiment, the latch circuit 150 is reset by the High-level input internal reset signal, causing the Env signal to return to the Low level from the High level (that is, the latch circuit 150 stops the output of the Env signal), as shown in FIG. 20.

When the Env signal goes from the High level to the Low level, the counter 160 stops counting, and the selector 120 switches from output of the ATC signals OUT, NOUT to output of the Low-level signals L, NL as the selected output signals SOUT, NSOUT.

In the third embodiment, the internal reset value set in the counter 160 is determined according to the fixed packet length of a burst optical signal. In Recommendation G.983.1 of the International Telecommunication Union Telecommunication Standardization Sector (ITU-T), however, packet length is defined in terms of cells referred to as minislots, which are subdivisions of slots, and a minislot can be allocated from three to fifty-five bytes of bandwidth. The packet length of the burst signal is thus variable. The third embodiment is not applicable to this and other cases in which the packet length cannot be predetermined, because the internal reset value cannot be predetermined.

In the fourth embodiment, accordingly, the High-level duration of the Env signal is made variable according to the packet length of the burst signal, by using the NSOUT output signal as the count reset signal, and by having the counter 160 continue counting after the completion of reception of the burst. This structure makes the envelope signal generating circuit 200 applicable to bursts with variable packet length, as shown in FIG. 20.

In the fourth embodiment, the counter 160 continues counting up to the predetermined internal reset value after the completion of reception of the burst signal, then outputs the internal reset signal, resetting the latch circuit 150 and returning the Env signal to the Low level.

In the fourth embodiment, the Env signal therefore remains High for a variable period from the start to the completion of the reception of a burst signal and for a predetermined period after the completion of the reception of the burst, until the count value reaches the internal reset value.

The internal reset value is determined according to the maximum run length specification of the multistage level discrimination circuit 4. More specifically, the internal reset value is set to the time (the number of bits) during which the '0' and '1' values of the ATC signals OUT, NOUT remain fixed after the completion of reception of the burst signal; this time is determined by the discharge time constant of the peak detection circuits in the multistage level discrimination circuit 4. This is also the time just before rebound noise occurs in the no-signal period.

As described above the reason why the Env signal remains High for a predetermined time even after the completion of reception of the burst signal is to distinguish the no-signal period from the reception of a run of identical codes (a run of '0', for example). In ITU-T Recommendation G.983.1, the maximum run length is set to 72 bits: a run of identical '0' or '1' codes may continue for 72 bits, but not for more than 72 bits.

If the internal reset value were less than the maximum run length specification, the Env signal might go Low when a variablelength burst signal starting with a run of '0' data was received, then go High when a '1' data signal was received after the end of the run of '0' data. Phase problems might then make it impossible to recover the first '1' bit after the run of '0' data. To avoid this problem, the fourth embodiment allows the Env signal to remain High for a predetermined period after the completion of burst reception.

The maximum run length specification of the multistage level discrimination circuit 4 is determined according to the time needed for spontaneous discharge by the peak detection circuits, that is, according to their time constants and the amplitude of the input burst signal. When a run of '0' data occurs in the burst signal, the peak detection circuits holding the '1' peak value do not maintain this peak value indefinitely but discharge spontaneously according to a certain time constant. If the run of '0' data were to continue past the point at which the peak value was no longer maintained, noise might occur in the ATC signal. Similar noise can occur after the reception of a burst is finished and no signal is received, a state equivalent to receiving a run of '0' data. To avoid such noise, the internal reset value in the counter 160 is set to a value that makes the Env signal go Low before the noise can occur.

As described above, in the fourth embodiment, the counter in the envelope signal generating circuit 200 continues counting after the completion of the burst optical signal. Accordingly, the fourth embodiment is applicable to communication systems in which a burst has a variable packet length, such as a length defined in terms of the minislots mentioned above.

In the fourth embodiment, the High-level Env signal is generated for a variable period from the start to the completion of the reception of a burst signal, and for a predetermined period after the completion of the reception of the burst, as described above. Accordingly, the fourth embodiment provides substantially the same effects as seen in the third embodiment, but is also applicable to variable-length burst signals.

Fifth Embodiment

Figure 21:
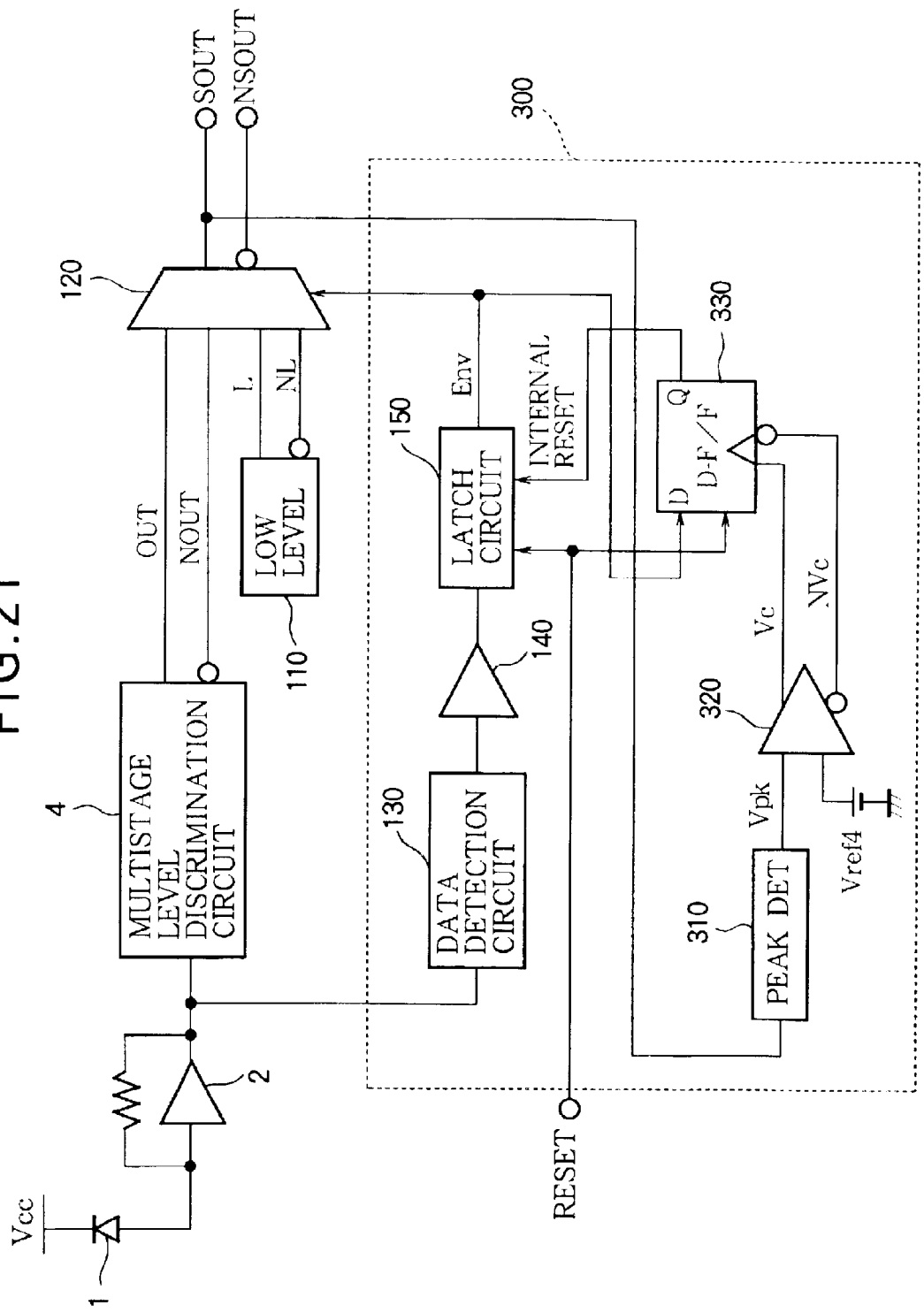
FIG. 21 shows the structure of a burst optical signal receiving circuit including a level discrimination circuit according to a fifth embodiment of the invention.

FIG. 21 shows the general structure of a level discrimination circuit according to a fifth embodiment of the invention, using the same reference characters as in FIG. 7 or FIG. 19 for similar elements. The level discrimination circuit in FIG. 21 comprises a photodiode 1, a preamplifier 2, a multistage level discrimination circuit 4 of the type described in the first or second embodiment, a Low level output circuit 110, a selector 120, and an envelope signal generating circuit 300. The level discrimination circuit in FIG. 21 differs from the multistage level discrimination circuit in the third or fourth embodiment (see FIG. 7 or FIG. 19) only in regard to the envelope signal generating circuit.

In the envelope signal generating circuits 100 and 200 in the third and fourth embodiments, the counter 160 counts a reference clock signal, and the Env signal goes Low when the count reaches a predetermined value. In the envelope signal generating circuit 300 in FIG. 21, however, the Env signal goes Low without the use of a counter or a reference clock signal.

Envelope Signal Generating Circuit 300

The envelope signal generating circuit 300 comprises a data detection circuit 130, a limiter amplifier 140, a latch circuit 150, a peak detection circuit 310, a differential amplifier 320, and a D-type flip-flop 330. The envelope signal generating circuit 300 senses the start of the reception of the burst optical signal from the amplified data detection signal input from the preamplifier 2, and detects the peak of the SOUT signal output from the selector 120. When the start of a burst signal is recognized, the envelope signal generating circuit 300 generates an envelope (Env) signal having a duration corresponding to the receiving period of the burst (the signal period), and outputs the Env signal to the selector 120. The Env signal is output for a period including the entire signal period of the burst, the period being variable according to the packet length of the burst, as in the fourth embodiment. More specifically, the duration of the Env signal is varied according to the detected peak of the SOUT signal. The envelope signal generating circuit 300 outputs the Env signal from the start of reception of the burst until the detected peak of the SOUT signal (which is generated from the signal OUT output from the multistage level discrimination circuit 4) falls to a predetermined level.

The envelope signal generating circuit 300 in FIG. 21 differs from the envelope signal generating circuit 100 or the envelope signal generating circuit 200 in the third or fourth embodiment by replacing the counter 160 with the peak detection circuit 310, the differential amplifier 320, and the D-type flip-flop 330. Instead of using a reference clock signal, the peak detection circuit 310. the differential amplifier 320, and the D-type flip-flop 330 use the SOUT signal output from the selector 120 to generate an internal reset signal that causes the Env signal to go Low.

Peak Detection Circuit 310

The peak detection circuit 310 detects the peak of the SOUT signal output from the selector 120, and outputs a peak detection voltage Vpk to the differential amplifier 320.

Differential Amplifier 320

The differential amplifier 320 outputs differential voltages Vc, NVc indicating the difference between the peak detection voltage Vpk and a reference voltage Vref 4.

D-type Flip-flop 330

The D-type flip-flop 330 detects the fall of differential voltage Vc (the rise of differential voltage NVc), and responds with a logic transition in the signal output from the D-type flip-flop 330 as an internal reset signal.

Figure 22:
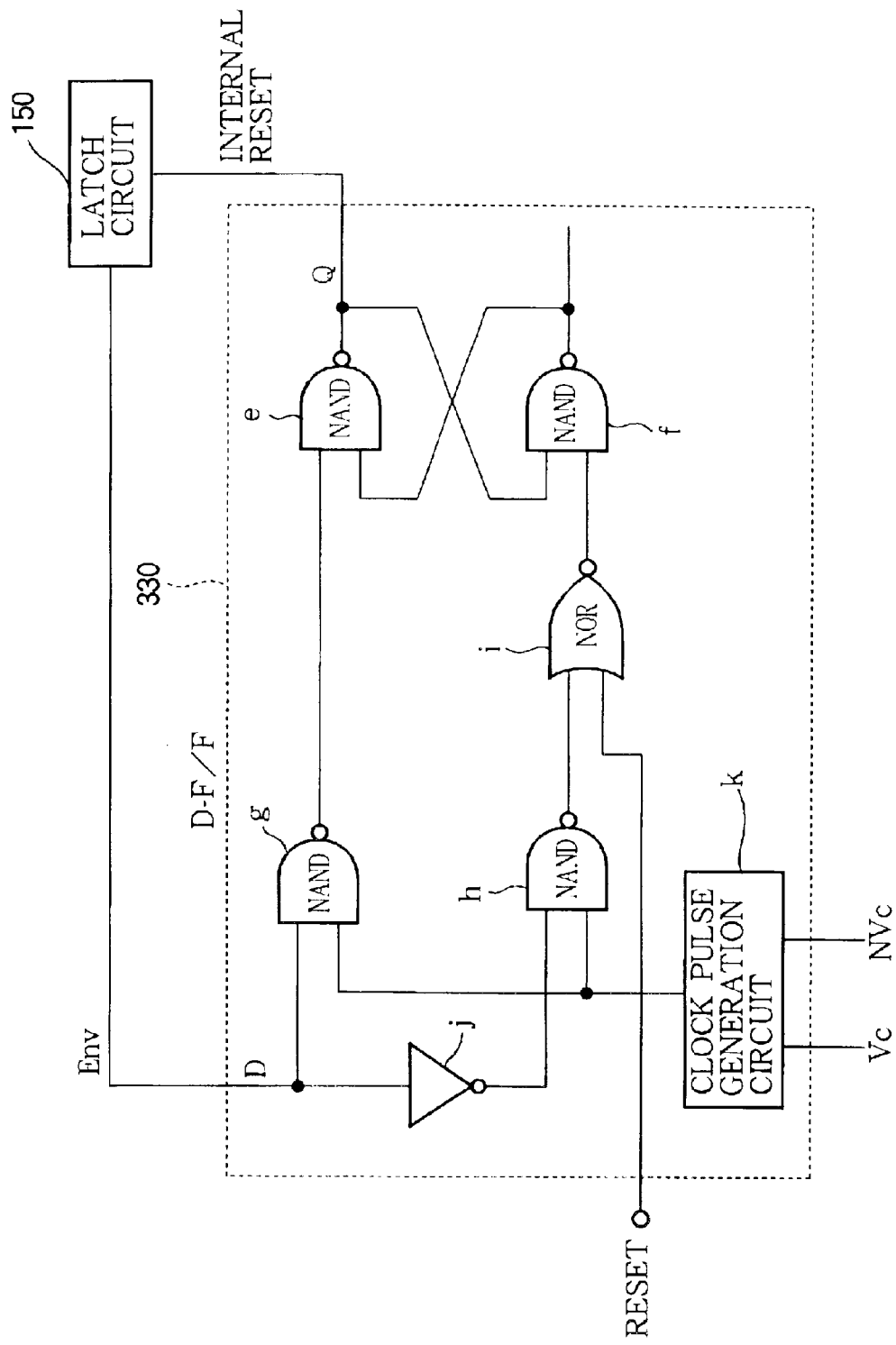
FIG. 22 shows an example of the internal structure of the D-type flip-flop in FIG. 21.

FIG. 22 shows an example of the internal structure of the D-type flip-flop 330. In this example, the D-type flip-flop 330 comprises two-input NAND gates (e, f, g, and h), a two-input NOR gate (i), an inverter (j), and a clock pulse generation circuit (k). The D-type flip-flop 330 receives the Env signal from the latch circuit 150 as a data input (input to a data input terminal D), receives a reset signal from the reset input terminal, receives the differential voltages Vc, NVc from the differential amplifier 320 as clock inputs, and generates logic transitions in the signal output from the data output terminal Q. When differential voltage Vc goes from the High level to the Low level and differential voltage NVC goes from the Low level to the High level, the clock pulse generation circuit (k) generates a High-level clock pulse, which is output to the first two NAND gates (g and h).

Figure 23:
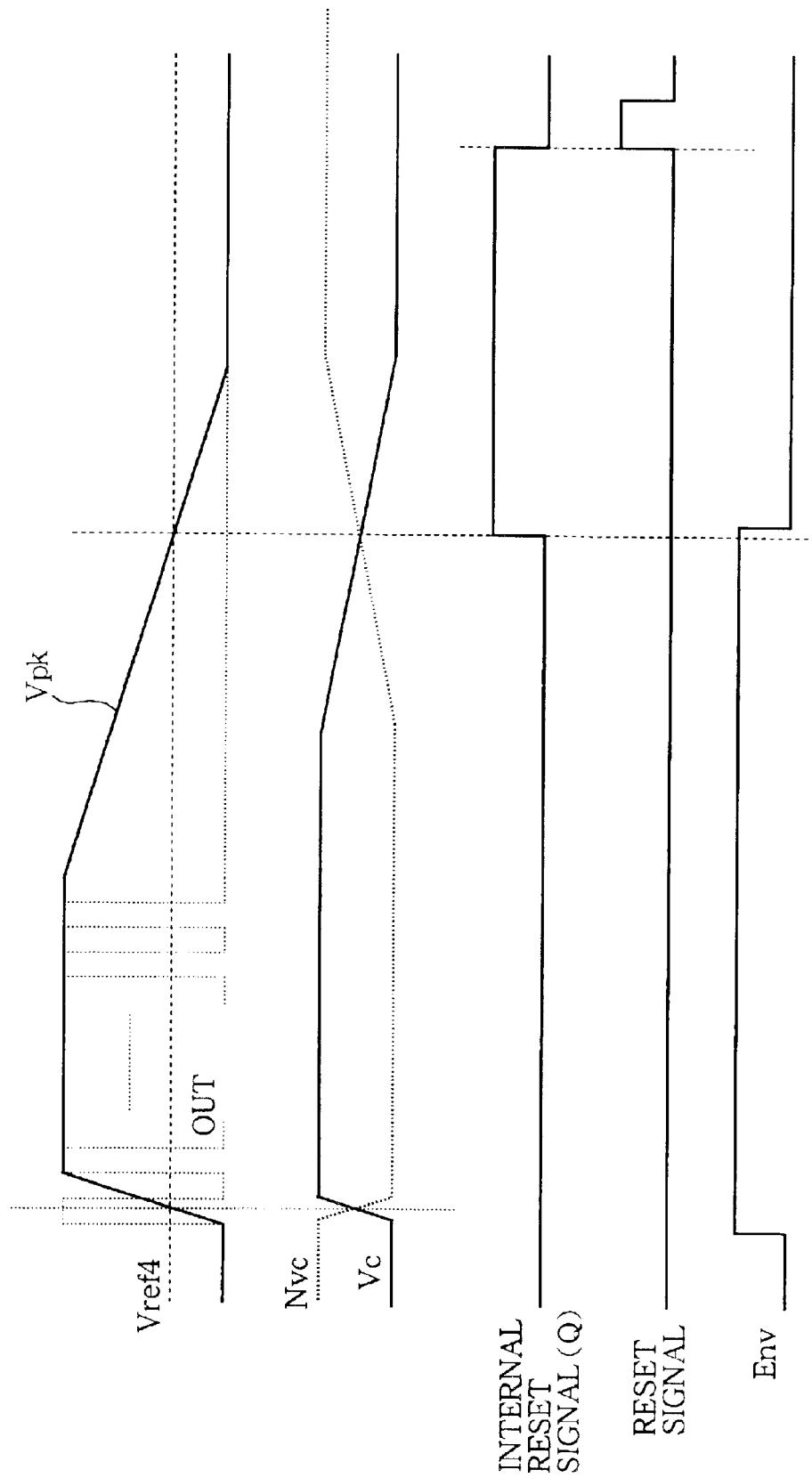
FIG. 23 is a timing diagram illustrating the operation of the envelope signal generating circuit in FIG. 21.

FIG. 23 is a timing diagram illustrating the operation of the envelope signal generating circuit 300 in the fifth embodiment. The operation of the level discrimination circuit in the fifth embodiment will be described below with reference to FIGS. 21 to 23.

When the reset signal is input to the latch circuit 150 from the reset input terminal, several bits before the burst packet begins, the latch circuit 150 is reset, forcing the Env signal to the Low level, as in the third embodiment. Input of the reset signal to the D-type flip-flop 330 (to NOR gate I in FIG. 22) resets the D-type flip-flop 330, forcing the internal reset signal (the Q output signal from NAND gate e in FIG. 22) to the Low level.

The Env signal is initially Low, so the selector 120 outputs the Low-level signals L, NL as signals SOUT, NSOUT. The peak detection voltage Vpk output from the peak detection circuit 310 is therefore less than the reference voltage Vref 4; the differential voltage NVc output from the differential amplifier 320 to the first NAND gate (g) in the D-type flip-flop 330 in FIG. 22 is High, and the differential voltage Vc output from the differential amplifier 320 to the second NAND gate (h) in the D-type flip-flop 330 In FIG. 22 is Low, as shown in FIG. 23.

When the transmission and reception of an optical signal burst starts and the burst signal shown in FIG. 23 is input to the data detection circuit 130, the Env signal goes from the Low level to the High level as described in the third and fourth embodiments: the data detection circuit 130 senses the first bit of the burst signal and outputs a data detection signal to the limiter amplifier 140; the limiter amplifier 140 amplifies the input data detection signal and outputs the amplified data detection signal to the latch circuit 150; the latch circuit 150 latches the amplified data detection signal from the limiter amplifier 140, outputs a High-level Env signal to the selector 120 and the data input terminal D of the D-type flip-flop 330 (to NAND gate g and inverter j in FIG. 22), and holds Env High until the High-level internal reset signal shown in FIG. 23 is input.

When the Env signal goes from the Low level to the High level, the selector 120 switches to output of the ATC signals OUT, NOUT as the selected output signals SOUT, NSOUT, as in the third and fourth embodiments, and supplies the ATC signal OUT to the peak detection circuit 310.

The peak detection circuit 310 detects the peak of the input ATC signal OUT, and outputs a peak detection voltage Vpk to the differential amplifier 320. More specifically, the peak detection circuit 310 is charged by the input High-level ATC signal OUT, and the peak detection voltage Vpk increases as the charge increases, rising comparatively quickly as shown in FIG. 23.

When Vpk exceeds Vref4, the differential voltage Vc output by the differential amplifier 320 goes from the Low level to the High level and the complementary differential voltage NVc goes from the High level to the Low level, as shown in FIG. 23. The High-level differential voltage NVc and the Low-level differential voltage Vc are output to the D-type flip-flop 330.

The D-type flip-flop 330 does not respond to the rise of differential voltage Vc (the fall of differential voltage NVc), so even when Vc rises and NVc falls as described above, the internal reset signal (Q) output from the D-type flip-flop 330 remains Low, as shown in FIG. 23.

When the transmission and reception of the burst signal is finished, the OUT signal output from the multistage level discrimination circuit 4 remains low, so the peak detection circuit 310 no longer receives any High-level signals. The peak detection circuit 310 discharges according to its discharge time constant, causing the peak voltage Vpk to fall gradually as shown in FIG. 23.

When Vpk falls below Vref4, the differential amplifier 320 switches differential voltage Vc from the High level to the Low level and differential voltage NVc from the Low level to the High level, as shown in FIG. 23, and outputs these differential voltages Vc, NVc to the D-type flip-flop 330.

When differential voltage Vc falls (differential voltage NVc rises), the D-type flip-flop 330 detects the fall, latches the High-level Env signal input to the data input terminal D, switches the internal reset signal (Q) from the Low level to the High level, and outputs a High-level internal reset signal to the latch circuit 150. More specifically, when the differential voltage Vc, which goes from the High level to the Low level, and the differential voltage NVc, which goes from the Low level to the High level, are input to the clock pulse generation circuit (k) in FIG. 22, the clock pulse generation circuit (k) outputs a High-level clock pulse to the first two NAND gates (g and h). The signal output from the first NAND gate (g) goes from the High level to the Low level in response to the High-level clock pulse. The internal reset signal output from the third NAND gate (e) goes from the Low level to the High level in response to the logic transition in the signal output from the first NAND gate (g).

As in the third and fourth embodiments, the latch circuit 150 is reset by input of the High-level internal reset signal, returning the Env signal to the Low level from the High level (that is, the latch circuit 150 stops the output of the Env signal), as shown in FIG. 23.

When the Env signal goes from the High level to the Low level, the selector 120 switches from output of the ATC signals OUT, NOUT to output of the signals L, NL from the Low level output circuit 110 as the selected output signals SOUT, NSOUT, as In the third and fourth embodiments.

When the High-level reset signal is input to the D-type flip-flop 330 from the reset input terminal, the D-type flip-flop 330 is reset by the reset signal, returning the internal reset signal (Q) to the Low level from the High level (thus halting the output of the internal reset signal), as shown in FIG. 23. More specifically, when the High-level reset signal is input to the NOR gate (i) in FIG. 22, the signal output from the NOR gate (i) goes from the High level to the Low level. The signal output from the fourth NAND gate (f) goes from the Low level to the High level because of the logic transition in the signal output from the NOR gate (i). The internal reset signal output from the third NAND gate (e) goes from the High level to the Low level because of the logic transition in the signal output from the fourth NAND gate (f).

In the fifth embodiment, the following requirements must be satisfied: (1) to eliminate rebound noise, the discharge time constant of the peak detection voltage Vpk (in the peak detection circuit 310) must be shorter than the discharge time constant of the multistage level discrimination circuit; and (2) the charge time of the peak detection voltage Vpk (of the peak detection circuit 310) must be shorter than the minimum packet length of the burst signal.

If these requirements above are satisfied, the fifth embodiment provides a simple way to configure a level discrimination circuit.

In the fifth embodiment, the peak of the ATC signal OUT is detected to generate an internal reset signal, as described above. Accordingly, the fifth embodiment provides substantially the same effects as seen in the fourth embodiment, but without requiring a counter and a reference clock signal. One consequent advantage of the fifth embodiment is that power consumption is reduced.

Furthermore, if a structure including a counter is used in an integrated circuit (IC) design, the multistage level discrimination circuit 4 may be affected by the logic transitions of the input reference clock signal, so it is difficult to implement the multistage level discrimination circuit 4 and the envelope signal generating circuit 100 or the envelope signal generating circuit 200 in a single IC. In the fifth embodiment, however, a reference clock signal is unnecessary so the multistage level discrimination circuit 4 and the envelope signal generating circuit 300 can be integrated as an IC, and products (such as an optical transmission module, for example) using the IC can be miniaturized.

Those skilled in the art will appreciate that the invention can be practiced in ways other than those illustrated by the preceding embodiments. The scope of the invention should accordingly be determined from the appended claims.

What is claimed is:

1. A level discrimination circuit comprising:

(a) a first offset compensation circuit including:

a first peak detection circuit detecting a first peak value of a first signal;

a first summing circuit generating a first sum value according to the first peak value and a second signal;

a second peak detection circuit detecting a second peak value of the second signal; and a second summing circuit generating a second sum value according to the second peak value and the first signal; and (b) a second offset compensation circuit including:

a third peak detection circuit detecting a third peak value of the second sum value;

a third summing circuit generating a third sum value according to the third peak value and the first sum value;

a fourth peak detection circuit detecting a fourth peak value of the second sum value; and a fourth summing circuit generating a fourth sum value according to the fourth peak value and the first sum value; and (c) a comparator generating an output signal according to the third and the fourth sum values.

2. A level discrimination circuit comprising:

a first offset compensation circuit receiving a differential pair of signals A1, NA1, detecting respective peak values AP1, NAP1 therein, adding signal A1 to the detected peak value NAP1 of signal NA1 to generate a first offset-compensated signal B1, and adding signal NA1 to the detected peak value AP1 of signal A1 to generate a second offset-compensated signal NB1; and a second offset compensation circuit receiving the signals B1 and NB1, detecting respective peak values BP1, NBP1 therein, adding signal B1 to the detected peak value NBP1 of signal NB1 to generate a third offset-compensated signal B2, and adding signal NB1 to the detected peak value BP1 of signal B1 to generate a fourth offset-compensated signal NB2;

further comprising a comparator comparing said signals B2 and NB2 and generating a positive-phase data output signal OUT and a negative-phase data output signal NOUT;

wherein the level discrimination circuit receives an optical signal in bursts, further comprising:

an envelope signal generating circuit for detecting the start of a burst of the optical signal and generating an envelope signal having a duration responsive to a length of said burst, starting when the start of said burst is detected;

a fixed signal generating circuit generating a fixed signal having a level representing non-reception of the optical signal; and a selector circuit selecting at least one of the positive-phase data output signal OUT and the negative-phase data output signal NOUT when the envelope signal is present, and selecting the fixed signal when the envelope signal is absent.

3. The level discrimination circuit of claim 2, wherein the envelope signal generating circuit comprises a counter receiving a reference clock signal, the counter starting to count when the start of the burst of the optical signal is detected, the envelope signal being terminated when the counter reaches a predetermined value.

4. The level discrimination circuit of claim 3, wherein the counter is reset by one of the signals selected by the selector circuit, and continues to count after being reset.

5. The level discrimination circuit of claim 2, wherein the envelope signal generating circuit comprises a peak detection circuit for detecting a peak level of one of the signals selected by the selector circuit, and a circuit for terminating the envelope signal when the detected peak level falls below a predetermined level.

6. A method of discriminating logic levels of a differential pair of signals A1, NA1, comprising:

detecting a peak value AP1 of signal A1;

detecting a peak value NAP1 of signal NA1;

adding said signal A1 to the detected peak value NAP1 of said signal NA1 to generate a signal B1;

adding said signal NA1 to the detected peak value AP1 of said signal A1 to generate a signal NB1;

detecting a peak value BP1 of said signal B1;

detecting a peak value NBP1 of said signal NB1;

generating a signal B2 by adding said signal B1 to the detected peak value NBP1 of said signal NB1; and generating a signal NB2 by adding said signal NB1 to the detected peak value BP1 of said signal B1.

7. The method of claim 6, wherein:

generating said signal B2 also includes subtracting said peak value NBP1, so that said signal B2 is referenced to said peak value NBP1; and generating said signal NB2 also includes subtracting said peak value BP1, so that said signal NB2 is referenced to said peak value BP1.

8. The method of claim 6, wherein:

generating said signal B2 also includes subtracting said peak value NBP1, so that said signal B2 is referenced to said peak value, NBP1; and generating said signal NB2 also includes subtracting said peak value BP1, so that said signal NB2 is referenced to said peak value, BP1.

9. The method of claim 6, further comprising comparing said signal B2 with said signal NB2 and thereby generating a positive-phase data output signal OUT and a negative-phase data output signal NOUT.

10. The method of claim 9, further comprising:

generating said signal A1 and said signal NA1 from an optical signal received in bursts;

detecting the start of a burst of the optical signal;

generating an envelope signal having a duration responsive to a length of said burst;

generating a fixed signal having a level representing non-reception of the optical signal;

selecting at least one of said positive-phase data output signal OUT and said negative-phase data output signal NOUT while the envelope signal is present; and selecting the fixed signal while the envelope signal is absent.

11. The method of claim 10, wherein generating the envelope signal further comprises counting a reference clock signal, the count starting when the start of the burst of the optical signal is detected, and terminating the envelope signal when the count reaches a predetermined value.

12. The method of claim 11, wherein generating the envelope signal further comprises restarting the count responsive to said at least one of said positive-phase data output signal OUT and said negative-phase data output signal NOUT.

13. The method of claim 10, wherein generating the envelope signal further comprises detecting a peak level of said at least one of said positive-phase data output signal OUT and said negative-phase data output signal NOUT, and terminating the envelope signal when the detected peak level falls below a predetermined level.

* * * * *